United States Patent [19]

Demaray et al.

[11] Patent Number: 5,252,194
[45] Date of Patent: Oct. 12, 1993

[54] ROTATING SPUTTERING APPARATUS FOR SELECTED EROSION

[75] Inventors: Richard E. Demaray, Oakland; John C. Helmer, Menlo Park; Robert L. Anderson, Palo Alto; Young H. Park, San Ramon; Ronald R. Cochran, Mountain View; Vance E. Hoffman, Jr., Los Altos, all of Calif.

[73] Assignee: Varian Associates, Inc., Palo Alto, Calif.

[21] Appl. No.: 919,074

[22] Filed: Jul. 23, 1992

Related U.S. Application Data

[63] Continuation of Ser. No. 471,251, Jan. 26, 1990, abandoned.

[51] Int. Cl.$^5$ .............................................. C23C 14/34
[52] U.S. Cl. ............................. 204/298.2; 204/192.12; 204/192.32; 204/298.19; 204/298.21; 204/298.22; 204/298.37
[58] Field of Search ................. 204/298.16, 298.17, 204/298.18, 298.19, 298.2, 298.21, 298.22, 298.31, 298.37, 192.12, 192.32; 156/345

[56] References Cited

U.S. PATENT DOCUMENTS

| | | | |
|---|---|---|---|
| 3,976,555 | 8/1976 | Von Hartel | 204/192.12 X |
| 4,422,916 | 12/1983 | McKelvey | 204/298.09 X |
| 4,444,643 | 4/1984 | Garrett | 204/298.09 X |
| 4,498,969 | 2/1985 | Ramachandran | 204/192.12 X |
| 4,581,118 | 8/1986 | Class et al. | 204/192.12 X |
| 4,631,106 | 12/1986 | Nakazato et al. | 156/345 |
| 4,714,536 | 12/1987 | Freeman et al. | 205/298.2 |
| 4,746,417 | 5/1988 | Ferenbach et al. | 204/298.2 |
| 4,872,964 | 10/1989 | Suzuki et al. | 204/298.2 |
| 4,880,515 | 11/1989 | Yoshikawa et al. | 204/192.12 X |

OTHER PUBLICATIONS

Anderson et al. "Sputtering Apparatus With a Rotating Magnet Array Having a Geometry for Specified Target Erosion Profile," U.S. Ser. No. 355,713, Filed May 22, 1989.
Anderson et al. "Sputtering Apparatus With a Rotating Magnet Array Having a Geometry for Specified Target Erosion Profile," U.S. Ser. No. 471,898, Filed Jan. 26, 1990.

Primary Examiner—Nam Nguyen

[57] ABSTRACT

A magnetron sputter source providing a predetermined erosion distribution over the surface of a sputter target material is described. When the distribution is uniform, close coupling of the sputter target with the substrate to be coated is achieved, resulting in improved collection efficiency of the sputtered material by the wafer and improved film thickness uniformity. Elimination of erosion grooves provide for greater target consumption and longer target life. The cathode magnetron sputter source includes a rotating magnet assembly of a specific shape and a specific magnetic strength provides the desired erosion distribution. The target may be dished to improve uniformity near the periphery of the wafer.

The resulting magnetron cathode is used for the deposition of thin films. Further applications of uniform magnetron erosion or preselected erosion include uniform or preselected magnetron sputter etch or reactive ion etch and concurrent deposition and etch.

28 Claims, 20 Drawing Sheets

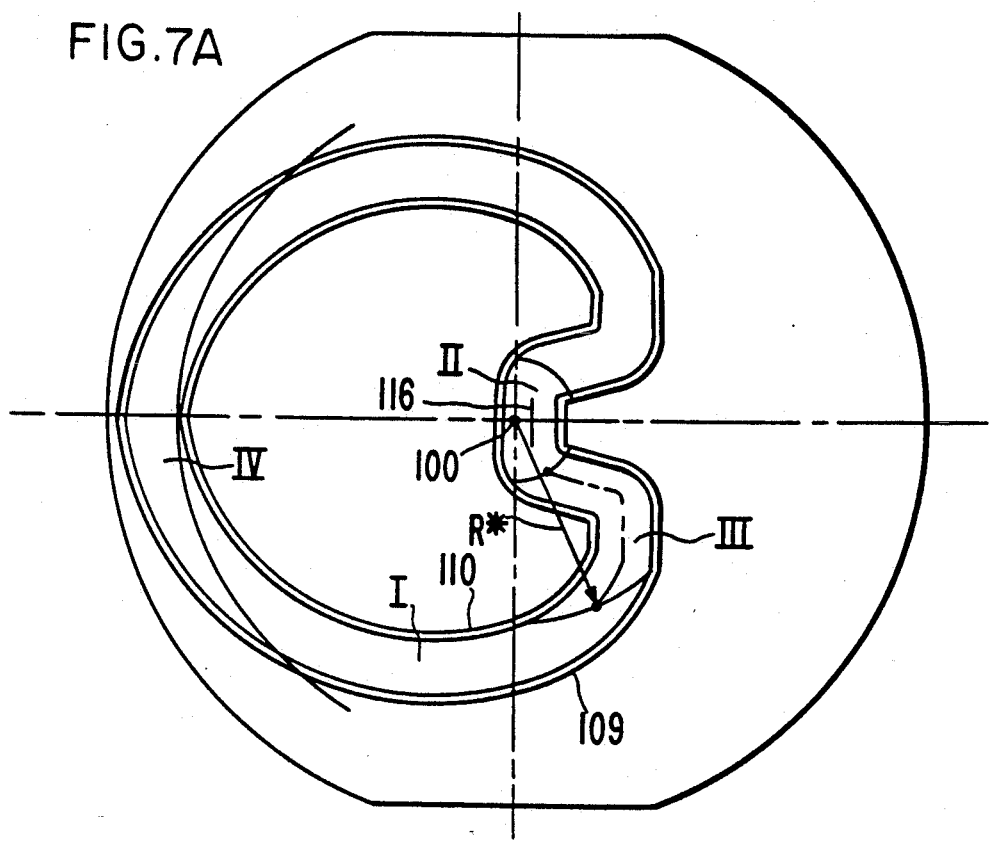
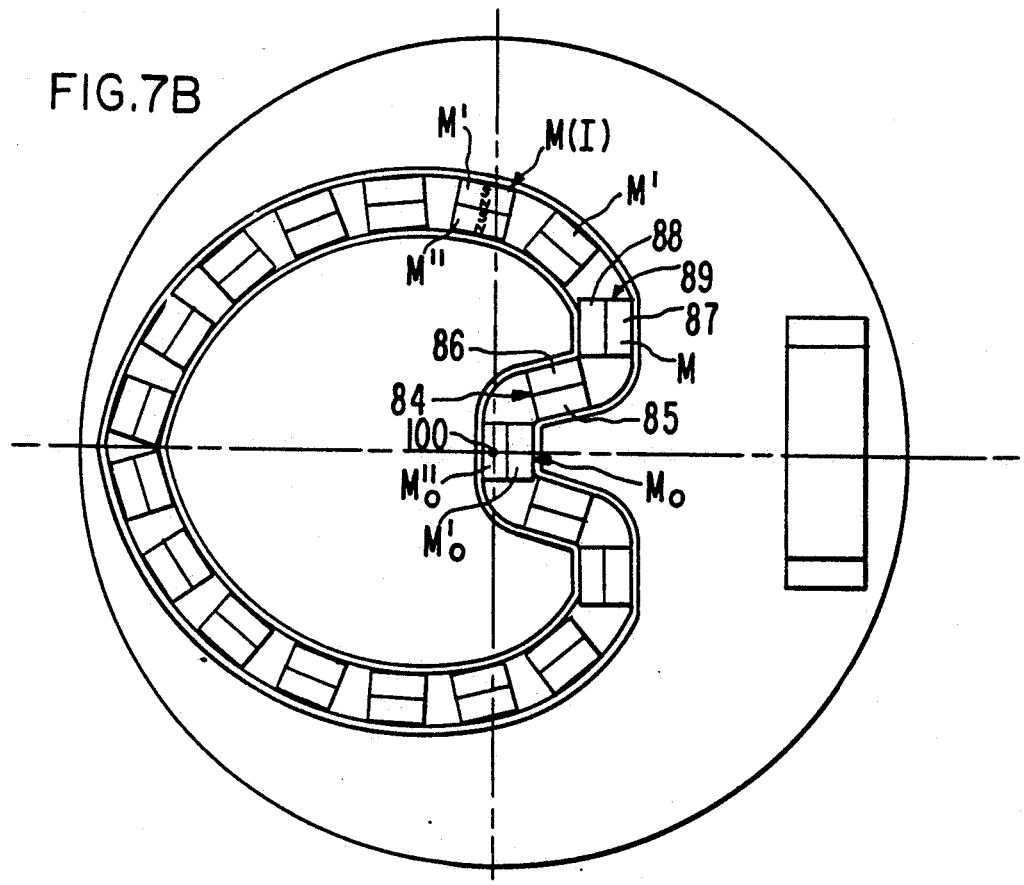

_5,252,194_

ROTATING SPUTTERING APPARATUS FOR SELECTED EROSION

This application is a continuation of U.S. application Ser. No. 07/471,251, filed Jun. 26, 1990 abandoned.

FIELD OF THE INVENTION

This invention relates to a rotating sputtering apparatus for uniform erosion, and in particular, to rotating sputtering apparatus for achieving uniform erosion in a disc like region at the center of rotation.

BACKGROUND OF THE INVENTION

Planar magnetrons have long been used by the semiconductor processing industry as sputtering devices to coat silicon wafers with various materials, for example, aluminum, during the manufacture of integrated circuits.

A sputtering device with a stationary planar magnetron is typically a high-rate sputtering device which represents an enormous improvement over devices based on diode sputtering or evaporative techniques. However, a sputtering device with a stationary planar magnetron has practical shortcomings, the most serious of which is that the plasma discharge erodes a narrow groove in the target. This localized erosion generates a non-uniform distribution of sputtered atoms which results in a deposition on a stationary semiconductor wafer having a non-uniform step coverage.

Numerous attempts, some partially successful, have been made to modify such a source to extend the target erosion and to make the distribution of sputtered atoms more uniform. For example, U.S. Pat. No. 4,444,643, which is incorporated herein by reference, describes as sputtering device which includes a mechanically rotated permanent magnet assembly. The rotation of the permanent magnet assembly causes erosion over a wider area of the target.

Special arrangements of magnets have also been suggested for producing more uniform erosion. One such arrangement is described in U.S. Pat. No. 4,872,964 entitled "Planar Sputtering Apparatus And Its Magnetic Source", which is incorporated herein by reference. The apparatus described in the above publication purports to achieve uniform erosion in the annular region between two concentric circles having a common center at the center of rotation of the magnet apparatus.

Japanese Patent Application publication (Kokai) No. 62-211,375, entitled "Sputtering Apparatus", published Mar. 11, 1986 describes another rotating sputtering apparatus, which purports to achieve, uniform erosion in an annular region which does not include the center of rotation.

Another approach for achieving uniform erosion in an annular region is described in U.S. patent application Ser. No. 355,713 entitled "Sputtering Apparatus With A Rotating Magnet Array Having A Geometry For Specified Target Erosion Profile" filed May 22, 1989 and assigned to the assignee hereof, which is incorporated herein by reference.

None of the above approaches is capable of achieving uniform erosion in a disk-like region by simple rotation of the magnet structure.

SUMMARY OF THE INVENTION

A magnetron sputter apparatus is disclosed which includes a magnetic means, which, upon rotation about an axis, produces a preselected erosion profile in a target. The axis of rotation is normal to the surface of the target and passes through the surface of the target at a point P.

The magnetic means is configured so that it produces a closed loop erosion path on the surface of the target which passes through P.

Means are provided to control the distance between the magnetic means and the surface of the target which may be operated to maintain a constant distance or a constant rate of deposition during operation.

In one embodiment, the magnetic means are constructed so that the strength of the magnetic means and the contour of the magnetic means together provide an erosion path which, when said magnetic means are rotated, generate a uniform erosion in a circular region of the target surface centered at P.

In one embodiment, the target is planar. In another embodiment, the target is dished, i.e. either convex or concave, and the magnetic means include a portion conformal with the dished target. In either of the above embodiments the magnetron apparatus may be configured as a sputter etch apparatus.

In another embodiment, the magnetic means is configured so that the product of the average magnetic strength of the field generated by the magnetic means and $\Sigma L(\text{Arc}(R))/R$ varies as the erosion profile with R for $R_1 \leq R \leq R_2$.

BRIEF DESCRIPTION OF THE DRAWINGS

FIG. 7A shows a plan view of the contours of pole pieces 109 and 110 for an alternate embodiment of the invention:

FIG. 7B shows a plan view of the magnet array assembly for FIG. 7A;

DETAILED DESCRIPTION

Figure 1:
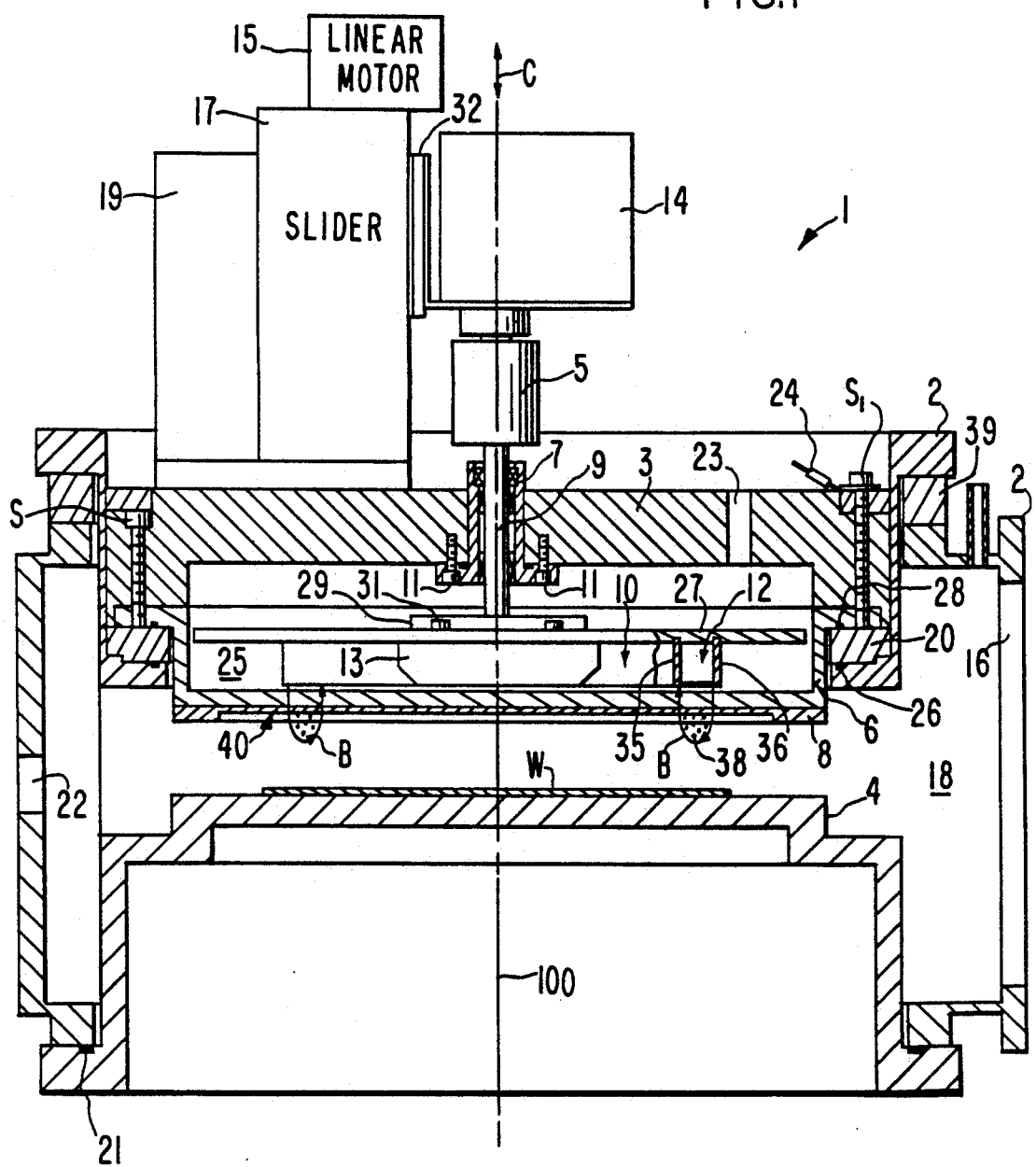
FIG. 1 shows a cross-sectional view of one embodiment of the rotating magnetron apparatus of the present invention.

FIG. 1 shows a cross-sectional view of one embodiment of rotating magnetron sputtering apparatus 1 of the present invention. Sputtering apparatus 1 includes stainless steel housing 2, substrate support table 4 for supporting substrate W, cathode (target) 8, magnet array housing 10 containing magnet array assembly 12 and motor 14 for rotating magnet array housing 10 and magnet array assembly 12 contained therein about axis 100.

Housing 2 includes port 16 which is connected to a vacuum pump (not shown) for evacuating vacuum chamber 18 defined by housing 2, substrate support table (anode) 4, cathode 8, cathode backing plate 6 and electrical insulator 20. O-rings 26 and 28 provide seals between housing 2 and insulator 20 and between insulator 20 and cathode backing plate 6. O-ring 21 seals between housing 2 and substrate support table 4. Housing 2 also includes port 22 which serves as an inlet/outlet for transferring a substrate into and out of vacuum chamber 18. Port 22 is sealable by a conventional gate valve (not shown). Substrate support table 4 and housing 2 are electrically grounded and substrate support table 4 contains conventional heating means (not shown) for controlling the temperature of a substrate W clamped thereto by clamping means (not shown).

After vacuum chamber 18 has been evacuated, inert gas at a controlled low pressure, for example Argon at 0.1 to 5 millitorr, is introduced into vacuum chamber 18 via gas inlet 39 in order to support the magnetron discharge 38.

Magnet array housing 10 is positioned in water chamber 25 which is defined by cathode backing plate 6 and fiberglass housing 3 which is fastened to cathode backing plate 6 by a plurality of circumferentially located fasteners S. Fastener S1 servers as an electrical conduit from cathode backing plate 6 to electrical connector 24 which is suitable for connecting to a negative DC high voltage source. Water or other cooling fluid is introduced into chamber 25 via inlet 23. Motor 14 turns shaft 9 via coupler 5. Motor shaft 9 extends through sliding, rotating sealing means 7 into chamber 25. Sealing means 7 is attached to fiberglass housing 3 by fasteners 11. Shaft flange 29 is attached to magnet array housing 10 by fasteners 31.

Motor mount 32 attaches motor 14 to slider 17 which is mounted to housing 2 by bracket 19. Linear motor 15 is mounted to slider 17. In operation, linear motor 15 is activated to drive motor 14, motor shaft 9, magnet array housing 10 and magnet array 12 attached thereto linearly along axis 100 as indicated by arrow C in FIG. 1. Linear motor 15 is employed to control the distance between the magnet array 12 and target 8. The ability to control this distance enables the operator to adjust the magnetic field, indicated by curved arrows B, below the surface of cathode 8 in chamber 18.

In the embodiment shown in FIG. 1, the planar portion of cathode 8 opposite wafer support table 4 has a diameter of 11.25 inches, and is suitable for sputter coating a substrate having an 8 inch diameter. The top surface of the wafer table is positionable from approximately one inch to three inches below the surface of target 8. Distances less than two inches are smaller than distances employed in prior art magnetron sputtering structures. Nevertheless, uniform sputter coating of substrate W is achieved due to the design of the magnet array 12 which permits uniform erosion of target 8 in a circular region 40 having a diameter of approximately 10 inches and centered at axis 100. This close coupling provides for high film collection efficiency. The distance of the top of table 4 from cathode 8 may be set by adjusting the size of spacer ring 39 to any selected value between one inch and three inches.

Figure 2A:
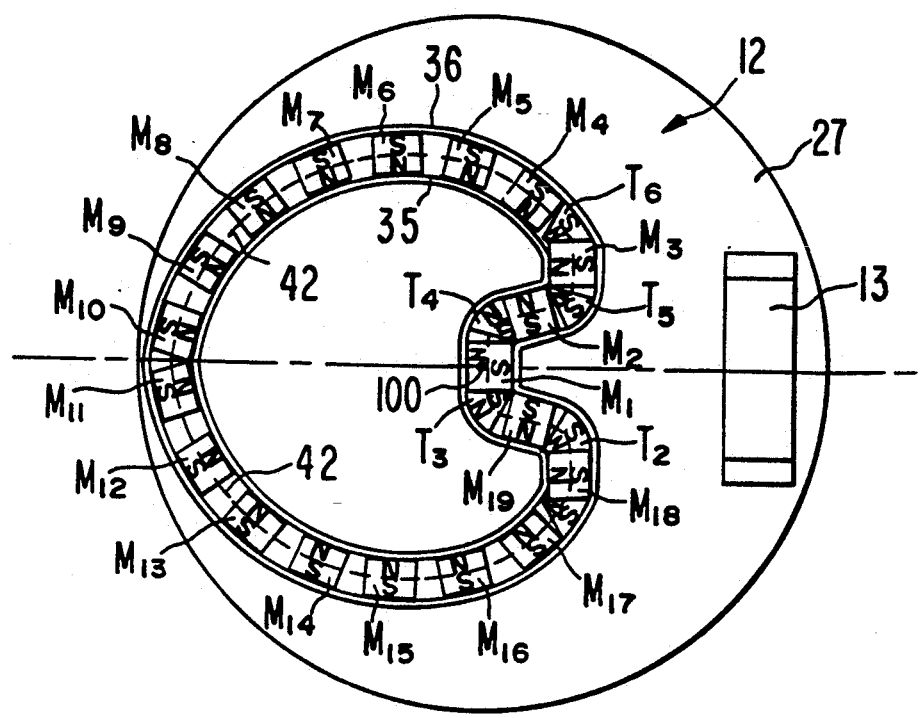
FIG. 2A shows a plan view of the magnet array assembly of FIG. 1.

FIG. 2A shows a plan view of magnet array 12. Square magnets $M_1$ through $M_{19}$ are arranged as shown between inner pole piece 35 and outer pole piece 36. The inner pole piece is North, the outer pole piece is South. The distance between the pole pieces is a constant, W. Square magnets $M_4$ through $M_{17}$ have equal strength of 35 Mega Gauss Orsteds (MGO). The axis of rotation 100 passes through the center of magnet $M_1$. Magnet $M_1$ has a strength of 8.75 MGO approximately that of magnets $M_4$ through $M_{17}$. Magnets $M_2$, $M_3$, $M_{18}$ and $M_{19}$ have a strength of 17.5 MGO, half as strong as magnets $M_4$ through $M_{17}$. Each triangle magnet $T_1$ through $T_6$ has a strength intermediate the strength of the square magnet on either side. The pole pieces 35 and 36, which restrain the magnets, are attached to magnet backing plate 27. The polepieces 35 and 36 serve to distribute the magnetic field so that the magnetic strength decreases continuously between magnet $M_4$ and $M_1$ and between magnet $M_{17}$ and $M_1$ as the center is approached. Counter weight 13 serves to balance magnet array 12 when plate 27 and array 12 are rotated about axis 100 by motor 14.

Figure 2B:
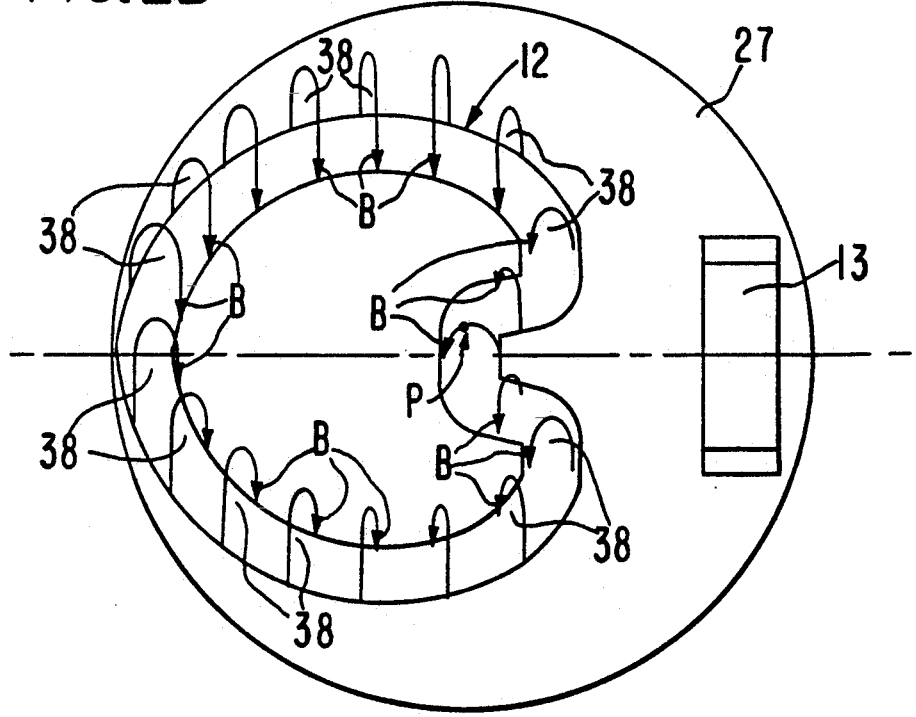
FIG. 2B shows a schematic perspective view of the magnetic field lines generated by the magnetic array of FIG. 2A.

FIG. 2B shows a plan view of the magnet array shown in FIG. 2A. The magnetic field lines, indicated by arrows B, extend through target 8 and define a magnetic tunnel which confines the magnetron discharge 38 to the closed loop region adjacent the surface of the target to be eroded. Energetic ions in the discharge bombard and erode target 6 by dislodging the atoms of the target, some of which coat the planar surface of substrate W.

If the magnet array 12 were to be held stationary in operation, a groove having the same path as magnet array 12 would be eroded in target 8. However, as explained below, the special shape of the centerline of magnet array 12, together with the gradations of strength of the magnets $M_1$ through $M_{19}$ in magnet array 12 permit uniform erosion of the circular region 40 of target 8 centered about axis 100 when magnet array 12 is rotated.

In order to explain the selection of magnet strengths and the shape of the centerline to achieve uniform erosion in a circular region, it is first helpful to describe the non-uniform erosion produced by a prior art sputtering device.

Figure 3A:
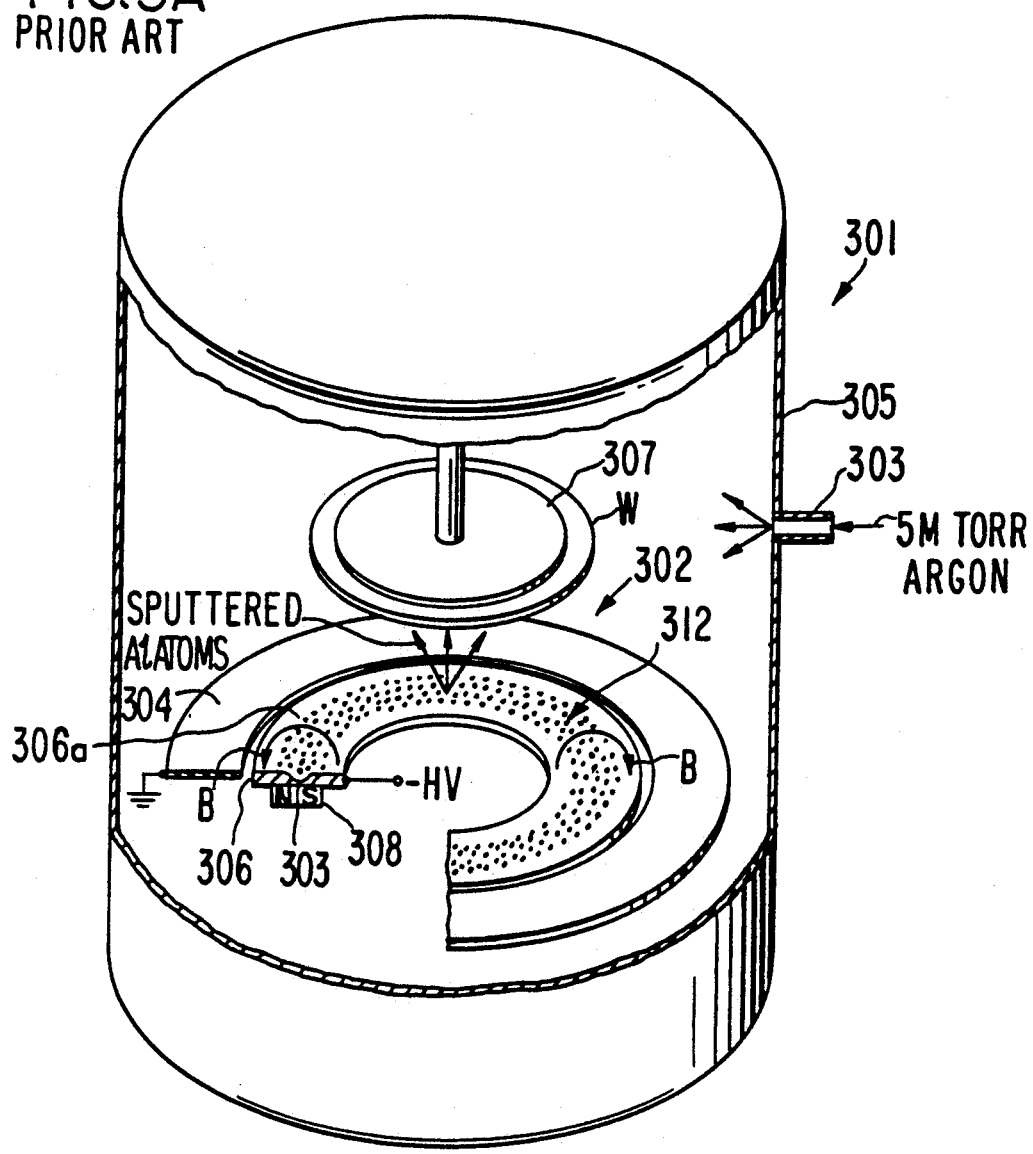
FIG. 3A shows a partially schematic perspective view of a prior art sputtering device which includes a stationary planar magnetron.
Figure 3B:
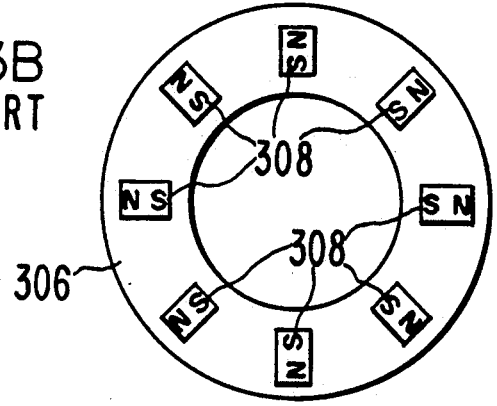
FIG. 3B shows a plan view of the magnet array for the device of FIG. 3A.

FIG. 3A shows a partially schematic perspective view of a prior art sputtering device 301 which includes stationary planar magnetron 302. Magnetron 302 includes anode 304 connected to ground potential and cathode (target) 306 connected to a negative high voltage source (not shown). Target 306 is in the shape of an annulus, initially (i.e. before sputtering occurs) having a planar top surface 306a. A plurality of permanent magnets 308 shown in FIG. 3B are arranged in a circular pattern beneath target 306. An inert gas, for example Argon at 5 millitorr, is introduced into vacuum chamber 305 containing magnetron 302 through gas inlet port 303. Vacuum chamber 305 is connected to a vacuum pump (not shown) for evacuation of the chamber before the introduction of the inert gas.

A wafer w is held by a suitable wafer holding means 307 attached to chamber 305 so that the planar surface of the wafer to be coated is exposed to and parallel to planar surface 306a of target 306.

In operation, the magnetic field lines, indicated by arrows B, confine the discharge to annular region 312, where energetic ions in the discharge bombard and erode target 306 by dislodging aluminum atoms, some of which coat the planar surface of wafer w. The energetic ions in the discharge erode an annular groove 303 in target 306. This localized erosion generates a non-uniform distribution of sputtered atoms.

Figure 3C:
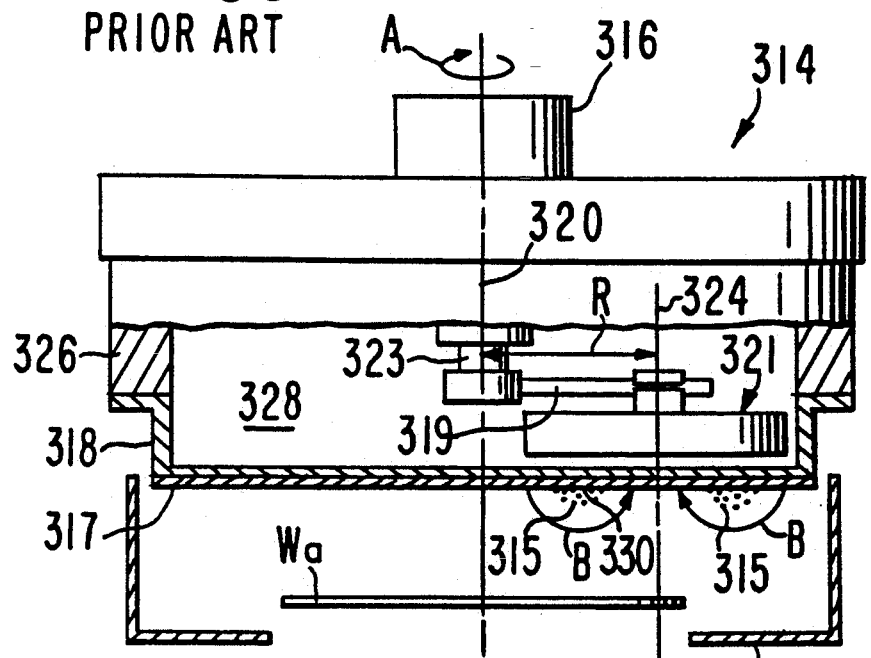
FIG. 3C shows a simplified view of a prior art sputtering device including a rotating magnet assembly.

FIG. 3C shows a simplified view of a prior art Versamag ™ sputtering source 314 sold commercially by Varian Associates, Inc., the assignee of the present application. It will be understood that source 314 is contained in a vacuum chamber (not shown), and that an inert gas is introduced into the chamber as explained in connection with FIG. 3A.

Source 314 includes motor 316 which rotates shaft 323 about axis 320 as indicated by arrow A. Magnet support shaft 319 extends perpendicularly from shaft 323 and supports magnet assembly 321 attached thereto. Thus the central axis 324 of magnet assembly 321 is displaced from axis 320 by a distance R.

Magnet assembly 321 includes a magnet array similar to that shown in FIG. 3B, with the permanent magnets arranged in a circle so that a circular annular discharge 315 confined by magnetic lines B is produced in operation.

Target (cathode) 317 is disk shaped and is connected to a negative high voltage source (not shown). Plasma shield 322, attached to the vacuum chamber (not shown) is electrically grounded and serves as an anode. Target 317 is bonded to the backing plate 318. Backing plate 318, which is attached to housing 326, supports target 317. Housing 326 together with backing plate 318 form a water-tight chamber 328 for holding a water bath for cooling the target.

Wafer w is supported by a wafer support (not shown) attached to the vacuum chamber so that the to-be-coated top surface $w_a$ of wafer w is beneath and parallel to target 317.

Figure 3D:
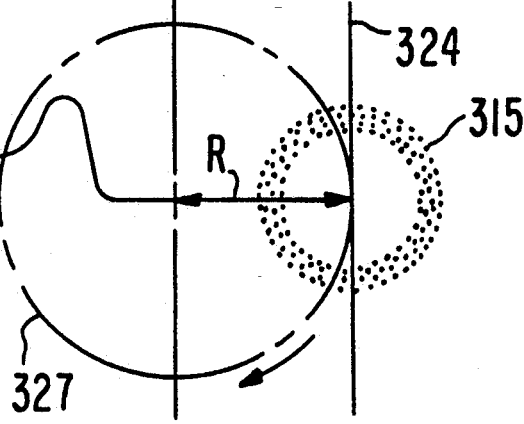
FIG. 3D shows the erosion profile generated by the source of FIG. 3C.

In operation, motor 316 rotates shaft 323 so that the entire magnet assembly 321 is rotated about axis 320. The erosion pattern produced in target 317 by this rotation is more complex than a simple groove. FIG. 3D, which is vertically aligned with FIG. 3C, shows a partial cross section (with the vertical scale enlarged for clarity) of target 317 which shows the depth profile of the erosion in target 317 generated by rotating magnet assembly 321 about axis 320 at a constant velocity a large number of times. Dot-dash line 327 shows the path of axis 324. Discharge 315 is shown in its initial position in FIG. 3D. Discharge 315 of course rotates with axis 324 about axis 320. As may be seen in FIG. 3D, the erosion of target 317 is not uniform when circular annular discharge 315 is rotated.

The theoretical basis of the present invention may be better understood by first considering why the erosion profile shown in FIG. 3D is non-uniform. The magnet assembly 321 shown in FIG. 3C has magnets 308 arranged circularly as shown in FIG. 3B so that the resulting circular discharge 315 (shown in FIG. 3C) may be assumed for present heuristic purposes to have uniform intensity in the discharge region 330 adjacent to the target 317 (the actual intensity may have other distributions as will be discussed hereinafter).

Figure 3E:
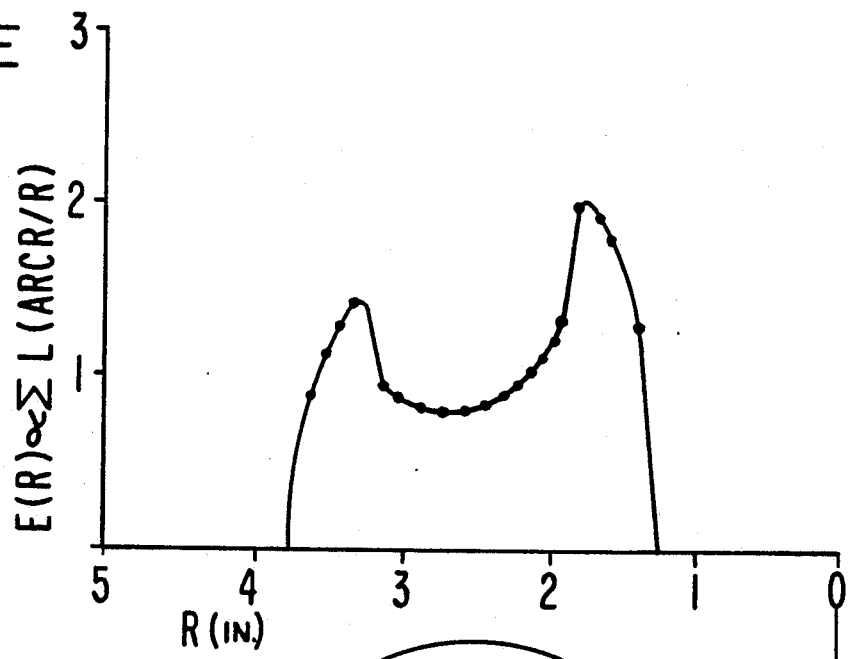
FIG. 3E shows the erosion profile generated by the rotation of the magnetic array shown in FIG. 3F.
Figure 3F:
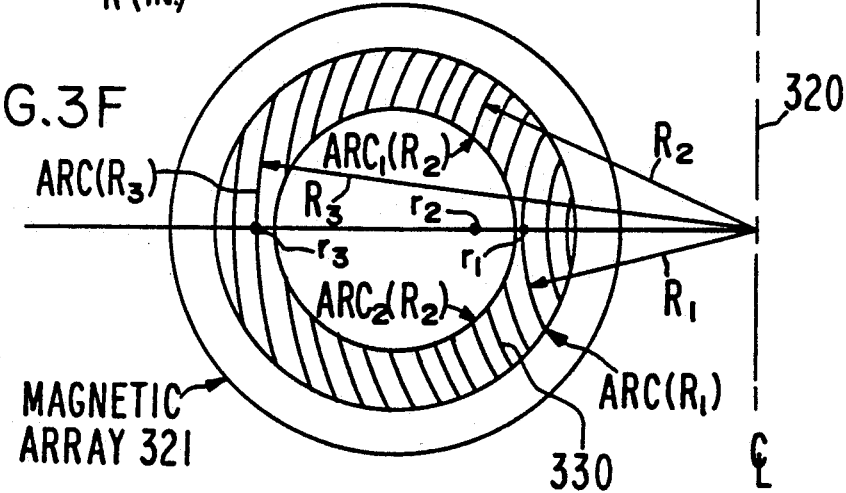
FIG. 3F shows the erosion region on the target generated by a stationary circular annular magnetic configuration.
Figure 3G:
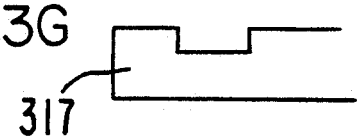
FIG. 3G shows the assumed stationary erosion profile generated by the magnetic assembly in FIG. 3F when said assembly is stationary.

If the magnet array 321 were held stationary, for instructive purposes, the erosion profile in target 317 can be assumed to have the form shown in FIG. 3G, which is aligned with FIG. 3F. That is, the erosion depth is constant over the width of annulus 330. The actual depth of the erosion would of course depend on the intensity of the discharge and the length of time the discharge was maintained over the target.

When the magnet array is rotated about axis of rotation 320 (axis 320 is normal to the plane of the paper in FIG. 3F) at a constant angular velocity, the amount (depth) of erosion at a point r on the erosion surface of target 317 which is at a distance of R linear units from the center of the target caused by each single complete rotation of discharge region 330 above target 317, denoted by E(R), is directly proportional to the total length of the arc segments in region 330 which rotate past the point r, i.e. to the total length of the arc segments at a distance R from the axis of rotation. In FIG. 3F, a single arc segment, Arc ($R_1$) rotates past point $r_1$ during each revolution. Two arc segments, Arc ($R_2$) and Arc$_2$($R_2$) rotate past point $r_2$ during each revolution. A single arc segment, Arc($R_3$) rotates past point $r_3$. The total length of the arc segments at a distance R from the origin is denoted by $\Sigma L(Arc(R))$, where $L(Arc(R))$ is the length of Arc(R). Thus, E(R) is directly proportional to $\Sigma L(Arc(R))$.

On the other hand, since the time it takes for an arc of unit length to rotate past a point which is at a distance R from the axis of rotation varies inversely with R, it follows that the erosion E(R) is inversely proportional to R.

Thus $$E(R) = \frac{k \Sigma L(Arc(R))}{R} \quad (1)$$

where k is the constant of proportionality which depends on the intensity of the discharge and other factors.

In FIG. 3E, the shape of the erosion due to rotation of the magnet array 321 in FIG. 3F is plotted by measuring the arc lengths and using equation 1 where we have assumed k=1. The individual arc lengths shown in FIG. 3F were measured with a flexible ruler to generate FIG. 3E.

The predicted average erosion pattern of FIG. 3E, in spite of the approximation used for the stationary erosion pattern of FIG. 3F, is close to that measured. The narrower the stationary erosion pattern the better is the approximation and the less the result obtained by rotation depends on the exact shape of the stationary erosion profile.

We assume that equation (1) is, to a first approximation, valid whether the summation is taken over the arc lengths for a single revolution or whether the summation is taken over arc lengths for N revolutions. In other words, the erosion depth for N revolutions is given by $$E_N(R) = \frac{k \Sigma L(Arc(R))}{R}$$

where the summation is taken over the arc lengths for N revolutions and $$E_N(R) = \frac{k \cdot N \Sigma L(Arc(R))}{R}$$

where the summation is taken over the arc lengths for a single revolution

In view of this superposition principle, two erosion profiles are equivalent if one is a scalar multiple of the other.

To a first approximation, if the constant k, which depends, inter alia, on the intensity of the discharge, is increased, for example, by a factor of 2, the same total depth of erosion may be obtained by decreasing the number of revolutions by a factor of 2.

The assumption that, to a first approximation, formula (1) is valid whether the summation is taken over 1 or more revolutions has been substantiated by erosion patterns observed experimentally (see which are close to the predicted erosion pattern shown in FIG. 3E.

To produce uniform erosion in an annular region, we proceed analytically as explained in U.S. patent application Ser. No. 355,713, now U.S. Pat. No. 4,995,958 to find an erosion path that satisfies $$E(R) = \frac{k \Sigma L(Arc(R))}{R} = K, \quad (2)$$

where K is an arbitrary constant, and has the additional property that the width of the path is a constant w.

Figure 3H:
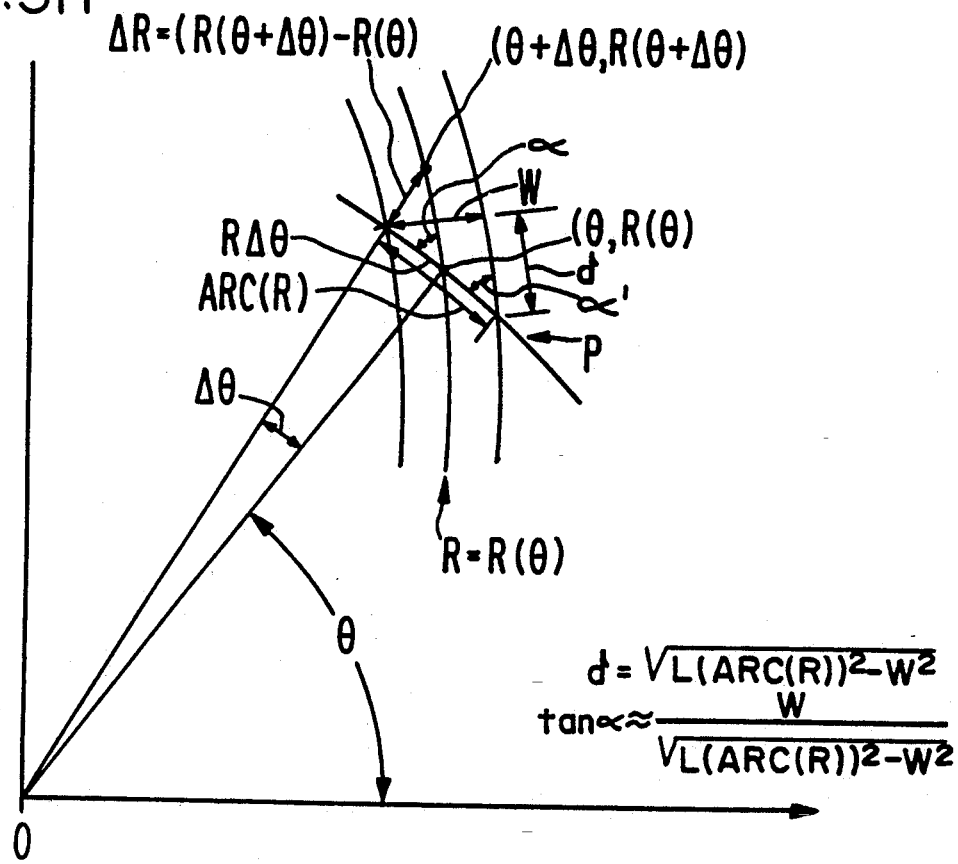
FIG. 3H shows the path element having constant width and the associated quantities for deriving the equation of the centerline of the path.

FIG. 3H shows an element P of a path having a centerline whose equation in polar coordinates is represented by $R = R(\theta)$. The width, w, of the path is assumed to be constant. Let $\alpha$ be the acute angle between the curve $R = R(\theta)$ and the arc segment Arc(R) at the point $(\theta, R(\theta))$. The arc segment Arc(R) extends from the outer edge of path segment P to the inner edge of the path segment.

We assume $$E(R) = \frac{kL}{R} = K \quad (3)$$

where $L = L(Arc(R))$ and k, K are constants. So $$\frac{L}{R} = k_1, \quad (4)$$

where $k = K/k$.

We see from FIG. 3H that $\tan \alpha \approx \tan \alpha' \approx w/d$ so $$\tan \alpha \approx \frac{w}{\sqrt{L^2 - w^2}}$$

This approximation improves for small path width w. We set $$\tan \alpha = \frac{w}{\sqrt{L^2 - w^2}} \quad (5)$$

On the other hand, from FIG. 3H we also have $$\tan \alpha \approx \frac{\Delta R}{R \Delta \theta}$$

Assuming that the curve $R = R(\theta)$ is differentiable at the point $(\theta, R(\theta))$, we have $$\tan \alpha = \lim_{\Delta\theta \to 0}\left(\frac{\Delta R}{R \Delta \theta}\right) \quad (6)$$

or $$\tan \alpha = \frac{1}{R} \frac{dR}{d\theta}$$

From equations (5) and (6) we have $$\frac{1}{R} \frac{dR}{d\theta} = \frac{w}{\sqrt{L^2 - w^2}}. \quad (7)$$

Substituting $L = k_1 R$ from equation (4), we have $$\frac{1}{R} \frac{dR}{d\theta} = \frac{w}{\sqrt{(k_1 R)^2 - w^2}} \quad (8)$$

-continued
or $$d\theta = \frac{\sqrt{((k_1/w)R)^2 - 1}}{R} dR.$$

We define $$R_0 = w/k_1. \quad (9)$$

$R_0$ is the minimum value of the radius R, since $\sqrt{((k_1/w)R)^2 - 1}$ is imaginary if $R < w/k_1$. In practice $R_0$ may be chosen arbitrarily for convenience of design since $k_1$ is arbitrary. Now define $$r = R/R_0 \quad (10)$$

so $$dr = dR/R_0 \quad (11)$$

Then equation (8) becomes $$d\theta = \frac{\sqrt{r^2 - 1}}{r} dr,$$

a differential equation that has the known solution $$\theta = \sqrt{r^2 - 1} - \arctan(\sqrt{r^2 - 1}) + C \quad (12)$$

or $$\theta = \sqrt{(R/R_0)^2 - 1} - \arctan(\sqrt{(R/R_0)^2 - 1}) + C, \quad (13)$$

where C is the constant of integration.

Equation (12) is called the normalized form of equation (13) and equation (13) is called the non-normalized form of equation (12).

Inspection of equation (12) shows that for positive r there is a real solution only if $r \geq 1$, that is, only if $R \geq R_0$. If we select $C=0$, then $\theta=0$ when $r=1$, i.e. when $R=R_0$. So that for this choice of C, the minimum value of R, $R_0$, occurs when $\theta=0$.

Figure 3I:
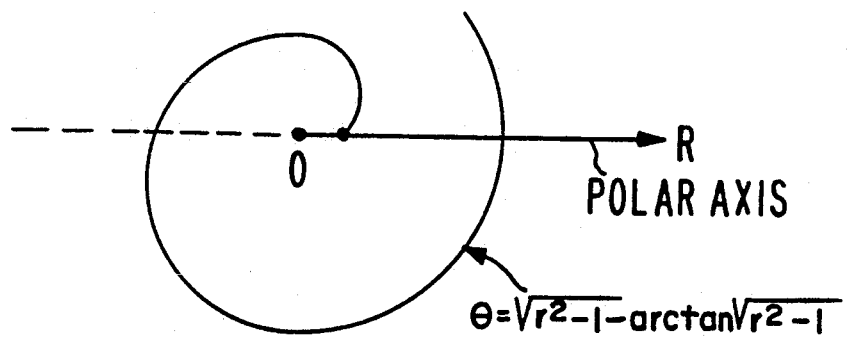
FIG. 3I shows a graph of the solution of Equation (13)

FIG. 3I shows a graph of the relationship between $\theta$ and $r = R/R_0$ defined by equation (12) where $C = 0$, i.e., by $$\theta = \sqrt{r^2 - 1} - \arctan \sqrt{r^2 - 1} \quad (14)$$

It is important to note that the centerline of the path spirals outward, and hence it is impossible to construct a closed loop path of constant width w satisfying equation (3)

$$E(R) = \frac{kL}{R} = K,$$

a constant, and which is differentiable at all points.

Figure 3J:
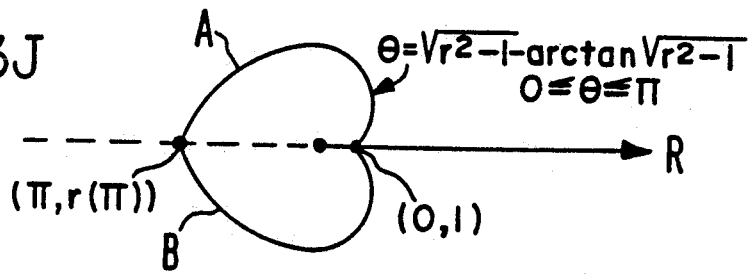
FIG. 3J shows a closed loop curve generated from the curve shown in FIG. 3I by reflecting a portion of the curve shown in FIG. 3I about the axis.

However, by making use of symmetry and relaxing the condition of differentiability at a finite number of points (which also renders the path of non-uniform width in a small neighborhood of such points), we can construct a closed loop path which in practice yields uniform erosion in an annular region when magnets of equal length and width are positioned with their centers on the line defining the center of the path to create an erosion path of uniform width (except at the points of non-differentiability). The maximum erosion of the target occurs along the curve on the target above which the tangents (not shown) to the magnetic field lines (shown, for example, in FIGS. 1 and 3A) are parallel to the surface of the target. This is defined to be the centerline of the magnetic means. This is also the line where the magnitude of the magnetic field parallel to the surface of the target, denoted by $B_x$, is a maximum. This centerline is coincident with the curve defined by equation (14). For example, the upper half A of the curve shown in FIG. 3J is defined by equation (14) where $0 \leq \theta \leq \pi$. The lower half B of the curve is obtained by reflecting the upper half about the polar axis. Note that the resulting closed curve fails to be differentiable at the two points $(O, R_0)$ and $(\pi, R(\pi))$.

Alternative closed loop paths (not shown) may be defined by taking any 180° segment of the curve defined by equation (14), where $\theta_0 \leq \theta \leq \theta_0 + \pi$ and $\theta_0 > 0$ is an arbitrary angle, and reflecting this segment about the line $\theta = \theta_0$.

Figure 3K:
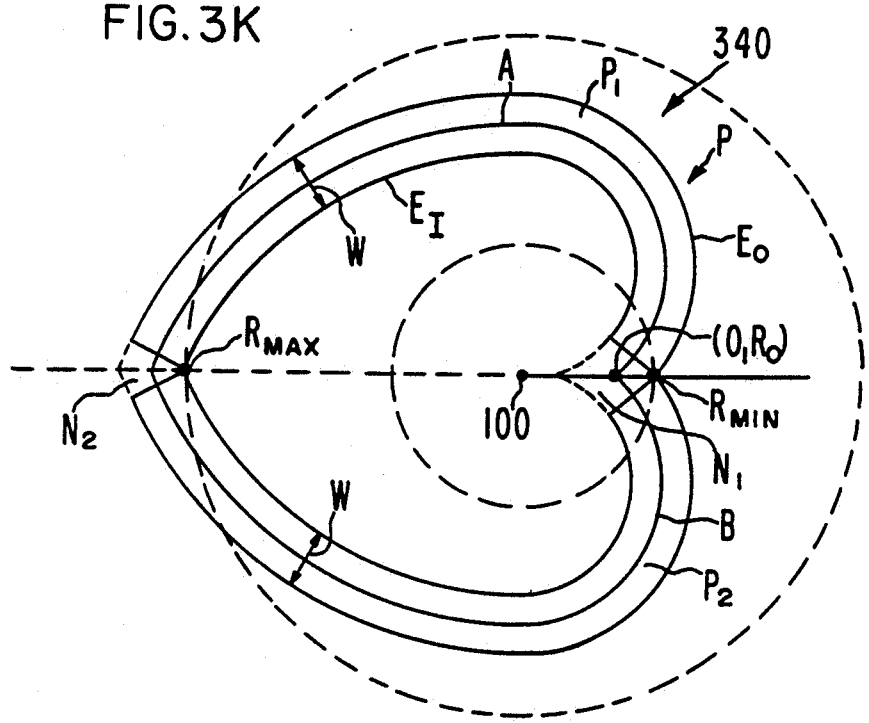
FIG. 3K is an expanded version of FIG. 3J showing a path of constant width centered around the upper and lower portions of the closed loop curve, except for relatively small regions at $\theta=0$ and $\theta=\pi$, where the width deviates from being constant.

FIG. 3K is an expanded non-normalized version of FIG. 3J where we have defined a path P comprising a segment $P_1$ of constant width w centered around most of the upper curve A and a segment $P_2$ centered around most of the lower curve B. Note that a constant width path is not defined in small neighborhoods $N_1$ and $N_2$ of the points of non-differentiability; however, we close the path at these points with the dotted lines shown in FIG. 3K. We define $R_{MIN}$ to be the point where the outer edge $E_0$ of the path P intersects the polar axis $=0$). We define $R_{MAX}$ to be the point where the inner edge $E_1$ of path P intersects the negative polar axis $(\theta = \pi)$. For any radius R between $R_{MIN}$ and $R_{MAX}$, we have $$\frac{\Sigma L(\text{Arc}(R))}{R} = K_1,$$

where $K_1$ is a constant.

Figure 3L:
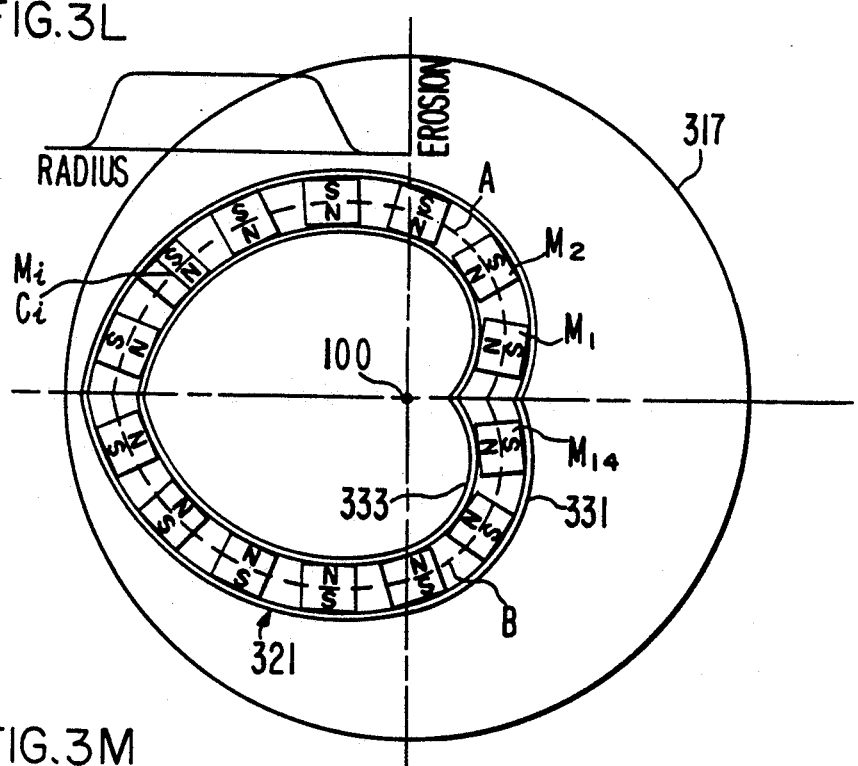
FIG. 3L shows a plan view of a magnet array for generating uniform erosion in an annular region.
Figure 3M:
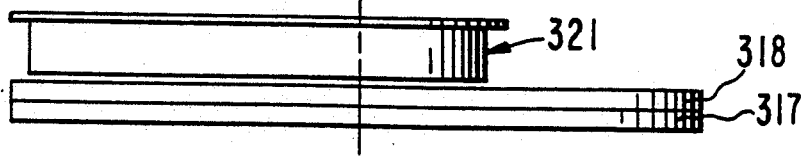
FIG. 3M shows a side view of the array of FIG. 3L.

FIG. 3L shows a layout of a magnet design for producing the erosion path shown in FIG. 3K. Permanent magnets $M_1$ through $M_{14}$ are sandwiched between iron pole pieces (keepers) 331, 333 which retain the magnets in position and act to distribute the magnetic field uniformly along the magnet and to accurately define the contour of the magnet. The keepers may be spot welded to a magnet support. Alternatively, the magnetic means may be a unitary magnet having the contour defined by keepers 331 and 333.

The curve A,B shown in FIG. 3K passes through the center of each magnet and the centerline $C_1$ of each magnet is perpendicular to the curve A,B. It is convenient for the thickness of the keeper to be sufficiently small so that it is flexible enough to be bent to the required contour. Tests were made to determine the required thickness for the iron keepers. Permanent magnets were placed between keepers of varying thickness. The magnets used were samarium cobalt with an energy product of 18 MGO having dimensions ⅜" by ⅜" by 0.32". In most cases two magnets were used to form each unit so the magnet was 0.64" deep. The spacing between the magnets was also varied. From these tests it was found that a thickness of 1/16 inch was sufficient (see Table 1 below).

TABLE 1

Effect of Keepers

| Separation | Keepers | B at 0.570 inch |
|---|---|---|
| 0.3 inch | 1/16 | 530 gauss |
| 0.3 | 3/32(1/16 ± 1/32) | 550 |
| 0.3 | 1/8(1/16 ± 1/16) | 550 |
| 0.3 | 1/8 | 550 |
| 0.45 | 1/16 | 450 |
| 0.45 | 1/8 | 450 |

When the magnet array shown in FIG. 3L is rotated around axis A, it produces uniform erosion at least in the annular region between $R_{MIN}$ and $R_{MAX}$ as indicated by the dotted lines in FIG. 3K.

The magnet array of FIG. 3L does not provide uniform erosion to the center of rotation when rotated about axis 100.

The magnet array of the present invention shown in FIG. 2A produces uniform erosion to the center of rotation when rotated about axis 100.

Figure 4:
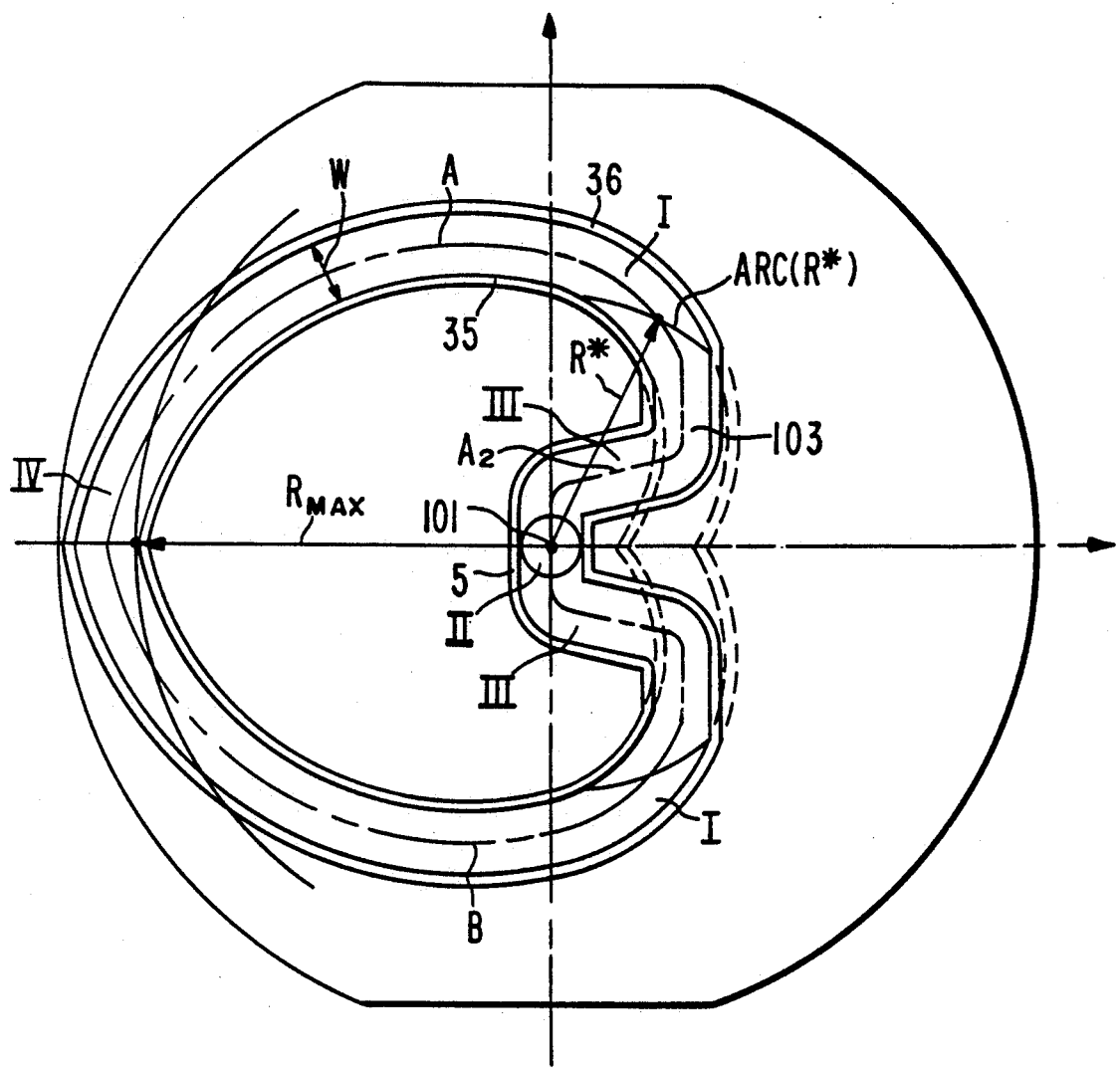
FIG. 4 shows a plan view of the pole pieces of the magnet array shown in FIG. 2A.

FIG. 4 shows a plan view of the pole pieces of magnet array of the present invention shown in FIG. 2A. In FIG. 4, R* is a selected radius greater than $R_{MIN}$. In region I, where $R^* < R \leq R_{MAX}$, and in region IV where $R_{MAX} \leq R \leq R(\pi)$, the centerline A of the upper half of the magnet array is defined by equation (13)

$$\theta = \sqrt{(R/R_0)^2 - 1} - \arctan(\sqrt{(R/R_0)^2 - 1}) + C \quad (13)$$

where $C = 0$.

That is, it coincides with the curve A shown in FIG. 3K. Similarly for $R > R^*$, the centerline of the lower half of the magnet array coincides with curve B shown in FIG. 3K.

Region II is defined to be the circular region centered at the axis of rotation 100 and having a radius of W/2 (where W is the width of the erosion region). In this example, W is the same as the distance between the pole pieces 35, 36. Centerline 101 in region II is the straight line segment passing through the origin at the axis of rotation which is equidistant from the corresponding straight line segments of pole pieces 35 and 36.

The centerline 103 in the upper half of region III, where $W/2 \leq R \leq R^*$, connects the centerline of region II with the centerline A in the upper half of region I. This centerline may be chosen to be any convenient smooth arc connecting the centerline in regions I and III. The pole pieces 35 and 36 are then bent conformally along this smooth arc so that the distance between the pole pieces is constant. The centerline in the lower half of region II is defined by symmetry about the polar axis. This completes the definition of the centerline of the magnet array in FIG. 2A.

Now by construction, in region I we have $$\frac{\Sigma L(\text{Arc}(R))}{R} = C_1, \text{ where } C_1 \text{ is constant} \quad (D-1)$$

so that $$E(R) = k_1 \left( \frac{\Sigma L(\text{Arc}(R))}{R} \right) = k_1 C_1 \quad (D-2)$$

where $k_1$ is the constant of proportionality which depends on the strength of the discharge in region I.

In region II, $$\frac{\Sigma L(\text{Arc}(R))}{R} = C_2 \quad (D-3)$$

so that $$E(R) = k_2 \left( \frac{\Sigma L(\text{Arc}(R))}{R} \right) = k_2 C_2 \quad (D-4)$$

where $k_2$ is the constant of proportionality which depends on the strength of the discharge in region II.

Comparing equations (D-2) and (D-4) we see that for the erosion to be the same in regions I and II we must have $$k_1 C_1 = k_2 C_2 \quad (D-5)$$

In the embodiment shown in FIGS. 2A and 4, where $W = 0.64$, it follows (by measurement) that $C_1 = 1.4$.

By construction, $C_2 = 2\pi \approx 6.28$

Substituting these values in equation (D-5), we see that the ratio of the strength of erosion in these regions is $$k_2/k_1 = 1.4/6.28 = 0.222 \quad (D-6)$$

In region I $$\frac{\Sigma L(\text{Arc}(R))}{R} = 1.4$$

In region II $$\frac{\Sigma L(\text{Arc}(R))}{R} = 6.28$$

Figure 5:
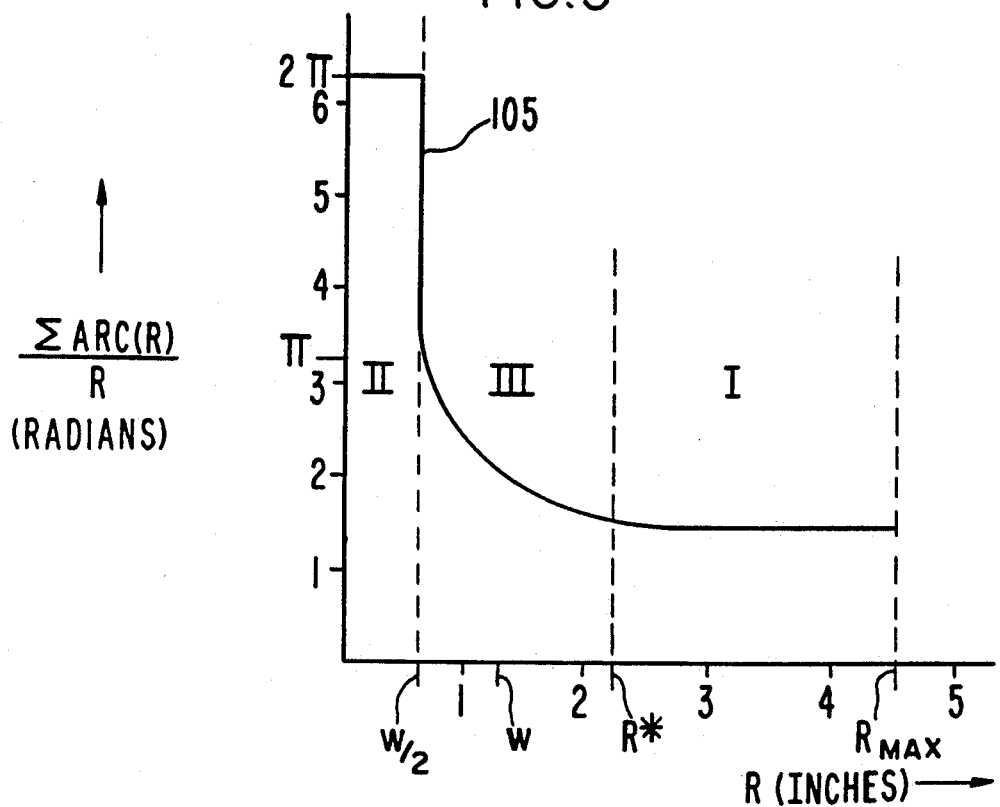
FIGS. 5 and 6 show the inverse relationship between $\Sigma Arc(R)/R$ and $k(R)$ for the case shown in FIG. 4.
Figure 6:
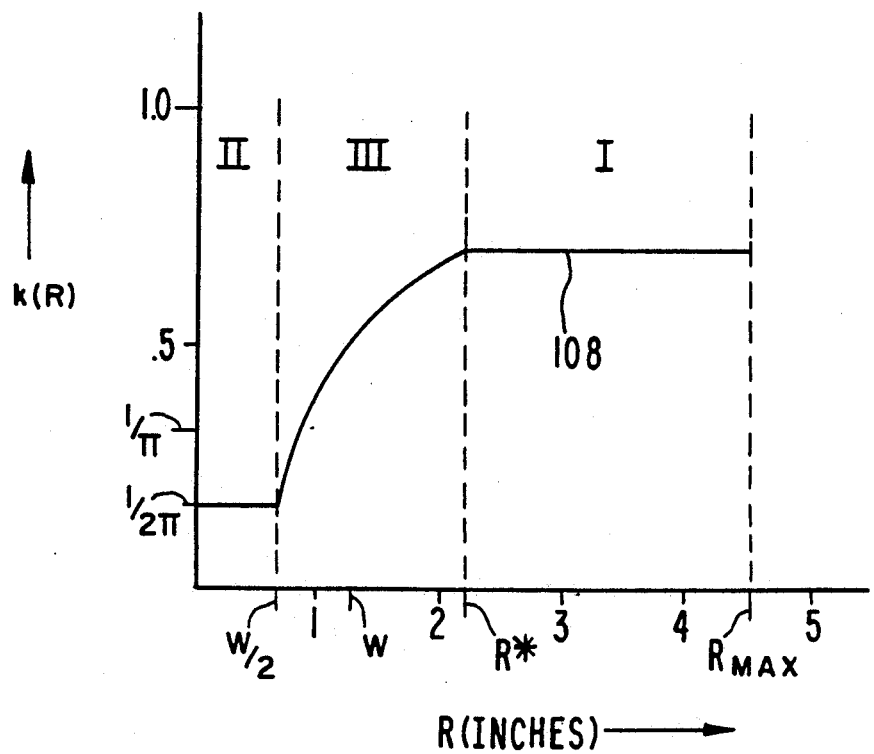

In region III $$\frac{\Sigma L(\text{Arc}(R))}{R}$$

decreases from 6.28 to 1.4 Curve 105 in FIG. 5 shows the graph of $$\left( \frac{\Sigma L(\text{Arc}(R))}{R} \right)$$

versus R.

In region III, $$E(R) = k_3(R) \left( \frac{\Sigma L(\text{Arc}(R))}{R} \right)$$

where $k_3(R)$ is the proportionality factor. In order for the erosion $E(R)$ to remain constant in region III, the proportionality factor must increase as $$\left( \frac{\Sigma L(\text{Arc}(R))}{R} \right)$$

decreases, i.e., $k_3(R)$ varies inversely with $$\left(\frac{\Sigma L(\text{Arc}(R))}{R}\right).$$

If the value of the erosion in region I is set equal to unity, then $$k_3(R) = \frac{1}{\left(\frac{\Sigma L(\text{Arc}(R))}{R}\right)}$$

This inverse relationship between $k_3(R)$ and $$\frac{1}{\left(\frac{\Sigma L(\text{Arc}(R))}{R}\right)}$$

is shown by curves 105 and 108 in FIG. 5.

The magnitude of the component of the magnetic field at the surface of the target parallel to the surface of the target at a point $P(R,\theta)$ is denoted by $B_x(R,\theta)$. The average magnetic strength over an arc of radius R in the erosion path which cuts across the erosion path boundaries at $P(R,\theta_{i-1})$ and $P(R,\theta_i)$ is defined by $$\overline{M}(R, \theta_{i-1}, \theta_i) = \frac{\int_{\theta_{i-1}}^{\theta_i} B_=(R, \theta)d\theta}{a_i} \quad \text{(D-7)}$$

where $$a_i = \theta_i - \theta_{i-1}. \quad \text{(D-8)}$$

We further define the average magnetic strength at radius R by $$\overline{M}(R) = \frac{\sum_{i=1}^{N} \int_{\theta_{i-1}}^{\theta_i} B_=(R, \theta)d\theta}{\sum_{i=1}^{N} a_i} \quad \text{(D-9)}$$

where N is the number of all such arcs.

If a complete circle of radius R is contained in the erosion path, we define $$\overline{M}(R) = \frac{1}{2\pi}\int_0^{2\pi} B_=(R, \theta)d\theta. \quad \text{(D-10)}$$

The factor $k_3(R)$ is approximately proportional to the average magnetic strength at radius R. practice we control the value of $k_3(R)$ by controlling the average magnetic strength at radius (R).

Returning now to the embodiment of FIGS. 2A and 4, since $k_2/k_1=0.222$ (see equation D-6), we chose the magnets in region II to have approximately ¼ the strength of the magnets in region I. Since $k_3(R)$ increases with increasing R in region III from the value in region I to the value in region II (see FIG. 5), we select magnets in region III having a strength intermediate to the strength of the magnets in region I and region II. We shall see below that the magnets for regions I and II may be positioned a selected distance below the surface of the target so that the magnitude of $B_z$ is substantially constant over most of regions I and II. Then in particular the average magnetic strength at radius R is substantially constant in regions I and II.

In operation, this means that the average intensity of the discharge at radius R is substantially constant in regions I and II.

FIG. 7A shows a plan view of the contours of pole pieces 109 and 110 for an alternate embodiment of the invention. Again, the distance between the pole pieces is a constant. The contours for regions I and IV are the same as those explained above in connection with FIG. 4. The principal difference between FIG. 7A and FIG. 4 is that flat segment 116 of the centerline does not pass through the center of rotation so that the path defined by the pole pieces is offset from the center.

The centerline of region III is again selected as a smooth curve connecting the centerline of regions I and II. Again, the magnets for region II should be selected so that the average magnetic strength at radius R is substantially constant (independent of R) in region II.

FIG. 7B shows a plan view of the magnet array assembly for the pole piece contours of FIG. 7A. In this case each magnet M comprises a pair of magnets M', M". Each magnet M' and M" of the pair of magnets for each magnet in region I have the same selected strength of 35 MGO. Magnet $M_0$ comprises two magnets $M_0'$ and $M_0''$ having strengths of 17.5 MGO and 8.75 MGO, respectively.

Magnet 84 in region III comprises magnets 85 and 86 having strengths of 17.5 MGO. Magnet 89 in region III comprises magnets 87 and 88 each having a strength of 26 MGO. The remaining magnets in region III are defined symmetrically. The poles of region II derive some strength from the magnets in region III. This transfer of strength tends to decrease the change in the average magnetic strength across region III.

Figure 7C:
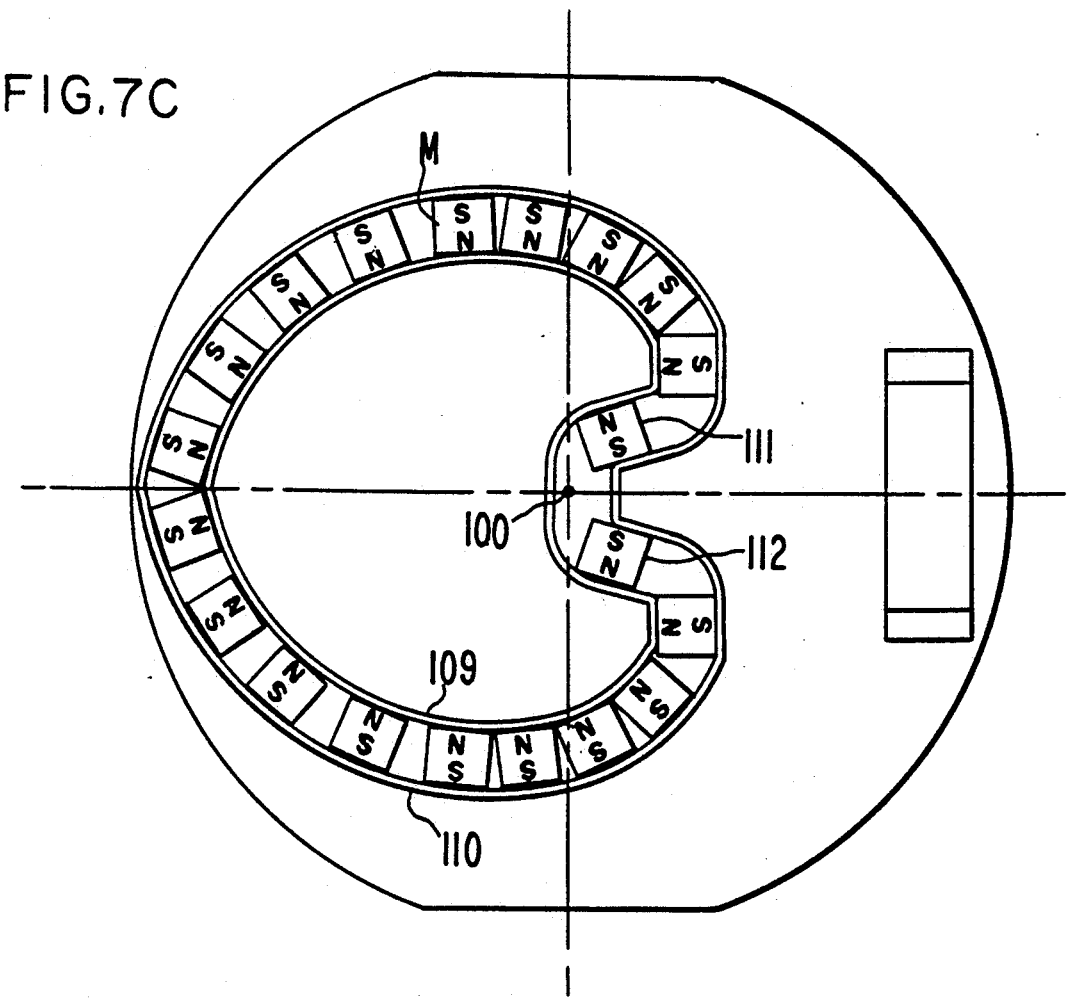
FIG. 7C shows an alternate magnet assembly for the pole contours shown in FIG. 7A.

FIG. 7C shows an alternate magnet assembly for the pole contours shown in FIG. 7A. In this embodiment, single piece magnets M are employed. In region I, each magnet M has a strength of 35 MGO. In region III, magnets 111 and 112 are degaussed to approximately ½ the strength of the magnets in region I. Magnets 110 and 111 are adjustable with respect to their distance from the axis of rotation 100. The average magnetic strength in region I is governed by the width of the pole pieces 109, 110 (0.092 inches), the strength of the magnets 111 and 112 and the distance of the magnets from axis 100.

Figure 8A:
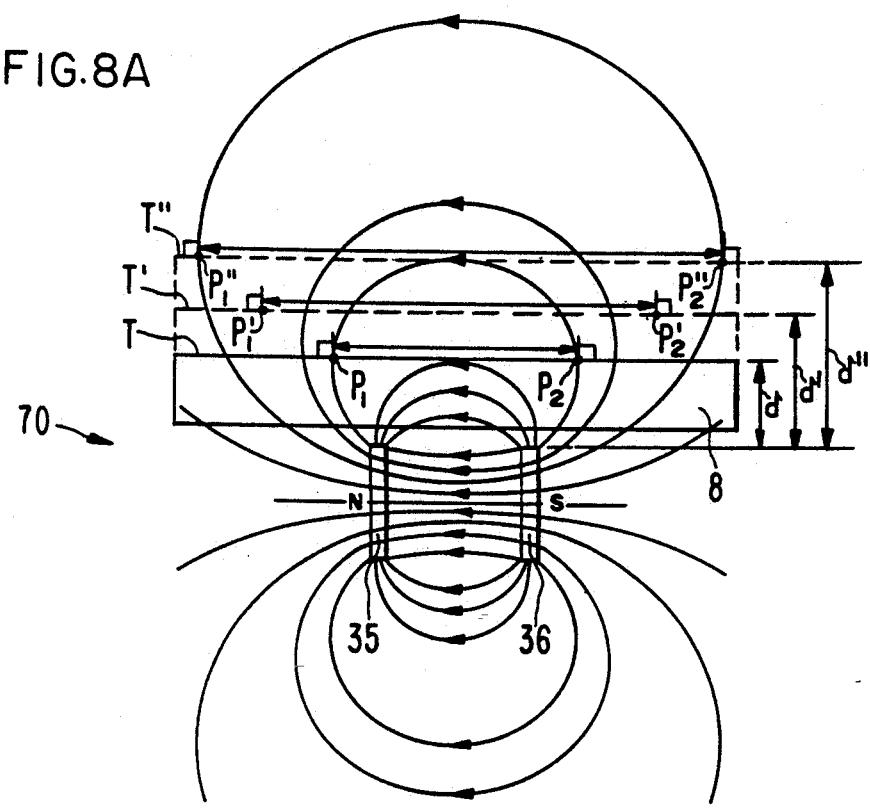
FIG. 8A shows a cross-section of a magnet and its magnetic flux lines.

FIG. 8A shows a cross-section (not to scale) of an individual magnet 70 having a strength of 35 MGO suitable for use with the present invention, for example, for the magnets $M_i$ in FIG. 2A, including a cross-section of pole pieces 35 and 36. Iron pole pieces 35 and 36 have a thickness of 0.125 inches. Magnet 70 has a height of 0.75 inches and a width (pole-to-pole) of 0.95 inches.

FIG. 8A also shows the cross-section of the so called "magnetic flux tubes" (not to scale) of the magnetic (B) field which extend over the sputtering surface T of target 8.

The distance d between the sputtering surface T and the surface of the magnet is controlled by slider motor 15 (FIG. 1) which moves magnet array 12 linearly along axis 100. To simplify the drawing, the target surface T is shown in phantom positions T' and T" rather than magnet 70.

In general, the magnetron erosion path on the surface of the target is confined to the region of the target between the two points $P_1$ and $P_2$ where the flux lines are perpendicular to the target. In other words, to the region between these two points where $B_x$ is non-zero. Outside the region of erosion the value of $B_x$ does not serve to sustain the magnetron erosion. $B_x$ will be taken as zero everywhere outside the region between the lines of flux that are perpendicular to the target surface.

As may be seen from FIG. 8A, the width of the erosion region increases as the distance between the magnet and the target surface to be eroded is increased. For example, when target T is in position T', the magnetron erosion path extends across the width between $P_1'$ and $P_2'$.

Figure 8B:
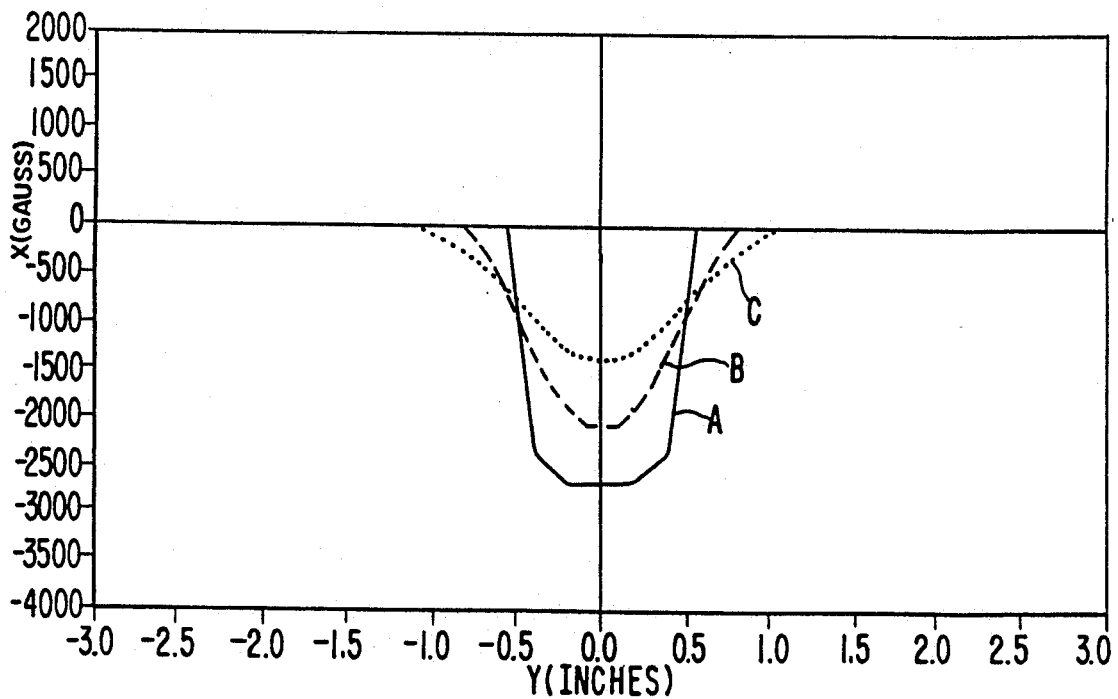
FIG. 8B shows the graph of the magnitude of $B_x$ along the surface of the target for the magnet of FIG. 8A for three different distances.

FIG. 8B shows the magnitude of B along the surface of the target for the magnet of FIG. 8A for selected distances d=0.5 inches (curve A), 0.75 inches (curve B) and 1 inch (curve C). In particular, it is important to note that for the curve A associated with a distance of 0.5 inches, the magnitude of B has an approximately constant value of $-2500$ Gauss. Hence, such a magnet position, where the magnitude of $B_x$ is approximately constant, would be suitable for construction such as that in FIG. 2A where the center of rotation is in the middle of the erosion region between the pole pieces and it is desirable to have an approximately constant $B_x$ field about the center of rotation.

Figure 9A:
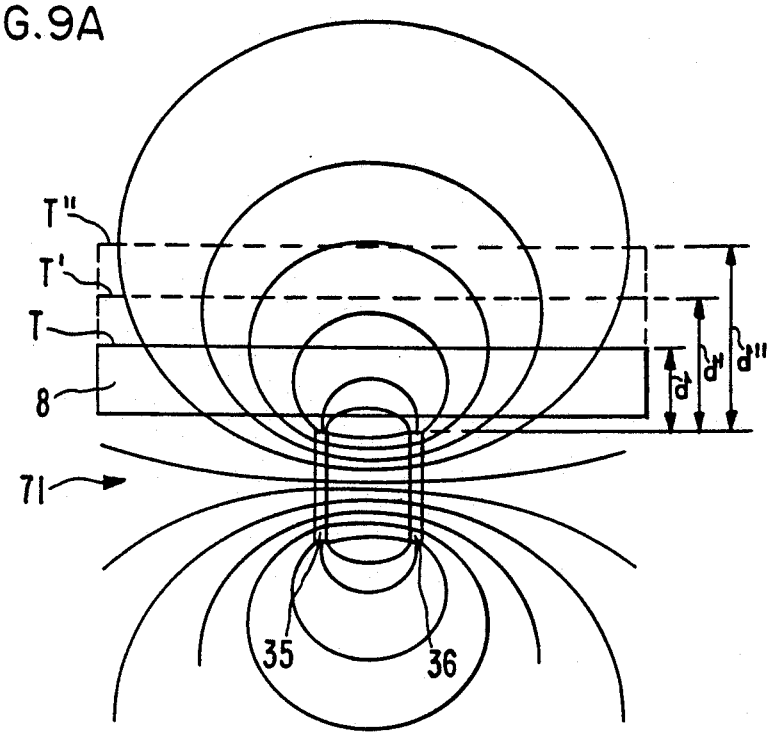
FIG. 9A shows a cross-section of a second magnet.

FIG. 9A (not to scale) shows a cross-section of a second permanent magnet 71 where the width of the magnet and the height of the magnet are 0.64 inches and 0.75 inches, respectively. Magnet 71 has a strength of 35 MGO and iron pole pieces having a thickness of 0.92 inches.

Figure 9B:
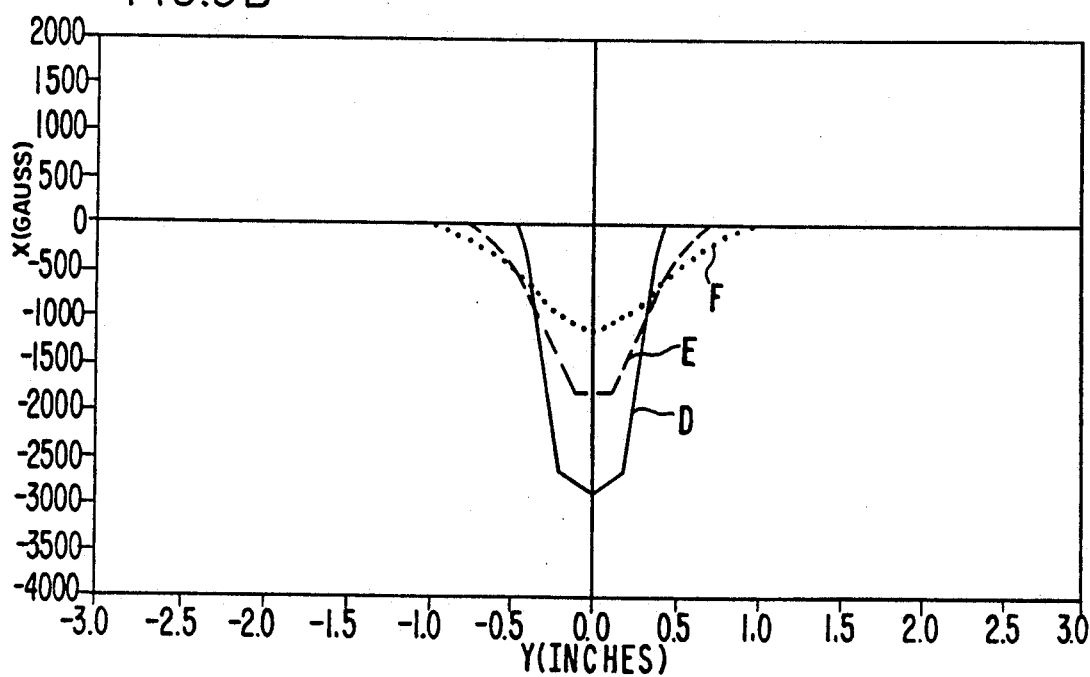
FIG. 9B shows the graph of $B_x$ at the surface of the target for three different distances between the magnet array of FIG. 9A and the surface of the target.

FIG. 9B shows a graph of three curves D, E, F representing the magnitude of $B_x$ across the surface of the target when the distance between the magnet surface and the erosion surface of the target is 0.5 inches, 0.75 inches, and 1.0 inches, respectively.

Note that for this construction of magnet 71, the B field for 0.5 inch spacing (curve D) is more peaked about the center than the corresponding curve A in FIG. 8B.

Figure 10A:
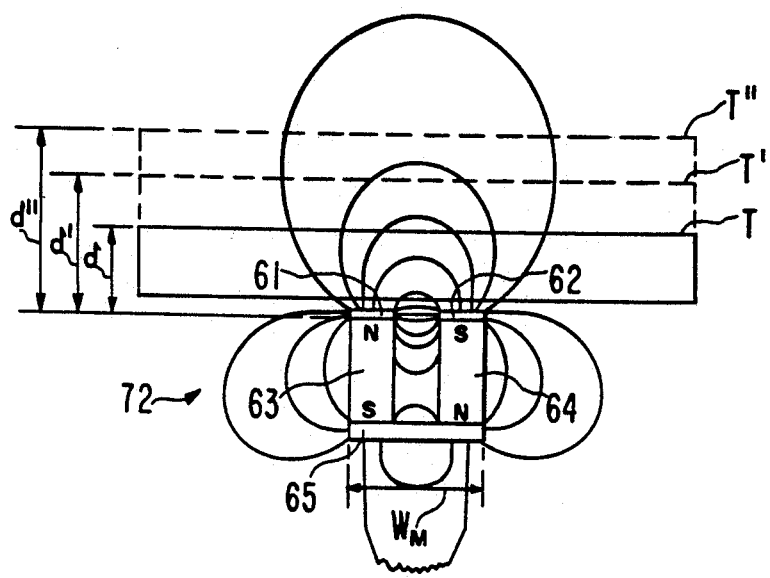
FIG. 10A shows a cross-section of a third magnet.

FIG. 10A shows a third magnet design. Magnet 72 comprises iron pole pieces 61 and 62 having a thickness of approximately 0.5 inches and two permanent magnets 63 and 64, each having a strength of 35 MGO, and attached in parallel, but with opposite orientation, to iron end piece 65. The width $W_m$ of the magnet is approximately 0.95 inches. The height of the magnets 63 and 64 is 0.75 inches. The width of the magnets is 0.34 inches.

Figure 10B:
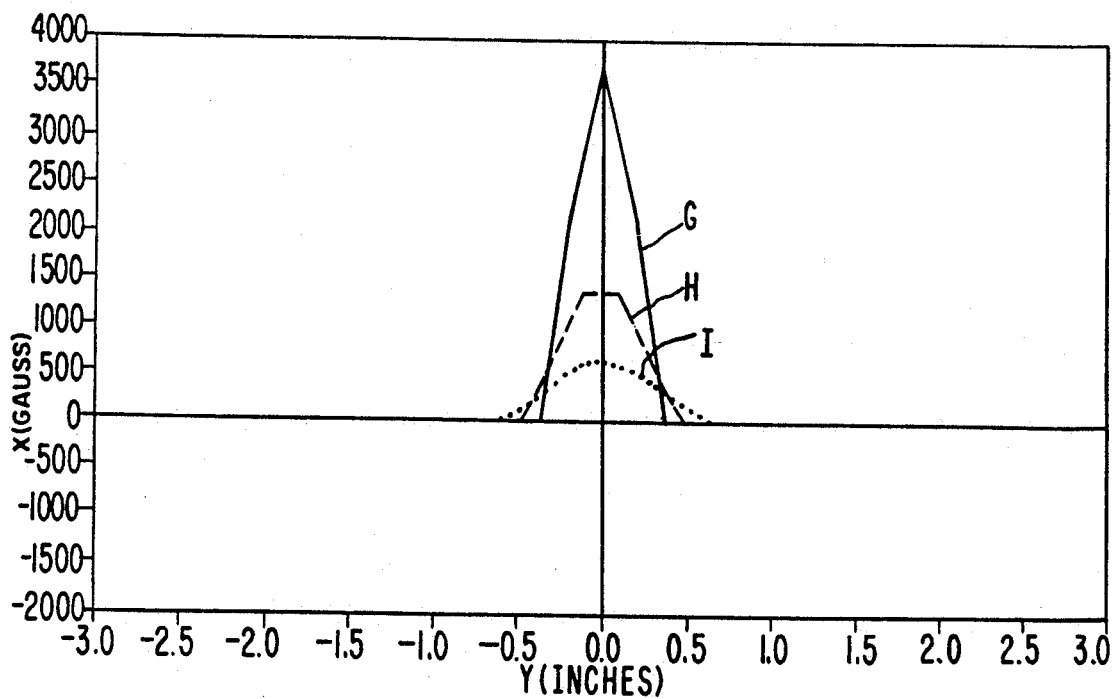
FIG. 10B shows the magnitude of $B_x$ along the surface of the target for the magnet of FIG. 10A as a function of three different distances between the magnet and the target.

FIG. 10B shows the graph of the curves G, H, and I which represent the magnitude of B at the target surface when the magnet 72 is positioned a distance of 0.5 inches, 1 inch and 1.5 inches from the surface of the target, respectively, as measured by the distance between the target surface and the pole pieces as shown in FIG. 10B. Note curve G is more peaked and has a triangular cross-section.

For all of the curves shown in FIGS. 8B, 9B and 10B, the width of the erosion path on the target surface is determined by the distance between the points where each of the curves crosses the horizontal axis, i.e. where $B_x$ is 0. Note also that the width of the erosion path is an increasing function of d for the range of distances shown. The maximum magnetic strength and the average magnetic strength are decreasing functions of d for the range of distances shown.

The magnet configuration shown in FIGS. 9A and 10A are best suited for the embodiments shown in FIGS. 7A, 7B and 7C where the center of rotation is offset from the point where the magnitude of $B_x$ is a maximum, so that the average magnetic strength is substantially constant in region II.

In all of the above embodiments, the distance between the pole pieces is constant, but the width and strength of the erosion region can be varied by adjusting the distance between the magnetic array and the surface of the target.

Figure 11A:
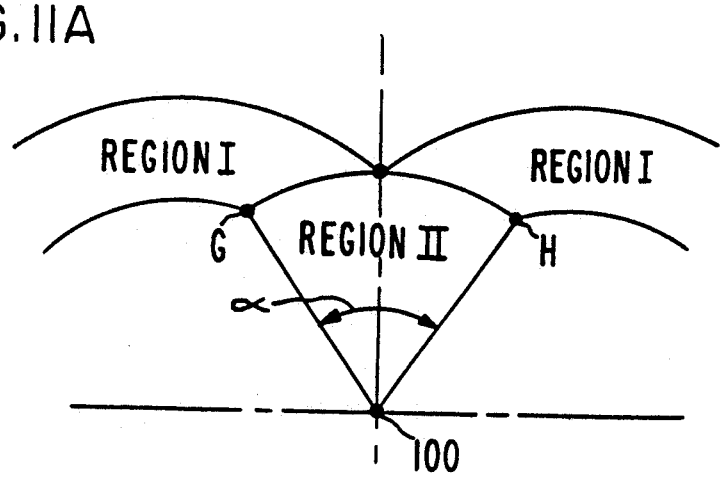
FIG. 11A shows a partial schematic drawing of an embodiment of the invention for extending erosion to the center of rotation employing a magnet of non-constant width.

FIG. 11A shows a partial schematic drawing of another embodiment of the invention for extending uniform erosion to the center of rotation (100) employing a magnet structure with non-constant width.

In region I the pole pieces have the same shape as that given for the pole pieces shown for region I in FIGS. 2A and 4, except R* is selected to be $R_{MIN}$. The same magnets used for region I in FIG. 2A are used in region I of FIG. 11A. Region II is the angular region subtended by the arc segment whose end points G,H are defined as the intersection of the circle of radius $R_{MIN}$ with the inner pole piece. This will be referred to as a pie shaped region.

A magnet having the shape of region II is formed using known powder metallurgy techniques and is magnetized uniformly so that the average magnetic strength is the same as in region I. In region II, $L(Arc(R)/R = \alpha$ by construction. In region I, $\Sigma(Arc(R))/R = C$ by construction of region I, but $\alpha = C$ since the arc is obviously equal at the boundary on the circle having radius $R_{MIN}$.

Figure 11B:
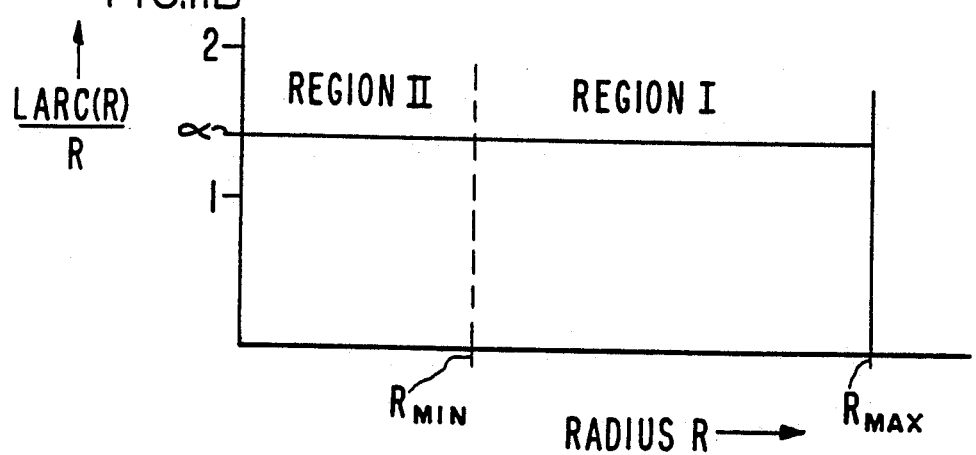
FIG. 11B shows $L(Arc(R))/R$ versus R for the embodiment of FIG. 11A.

FIG. 11B shows the graph of LArc(R)/R versus R, which is constant in both regions I and II.

Figure 12:
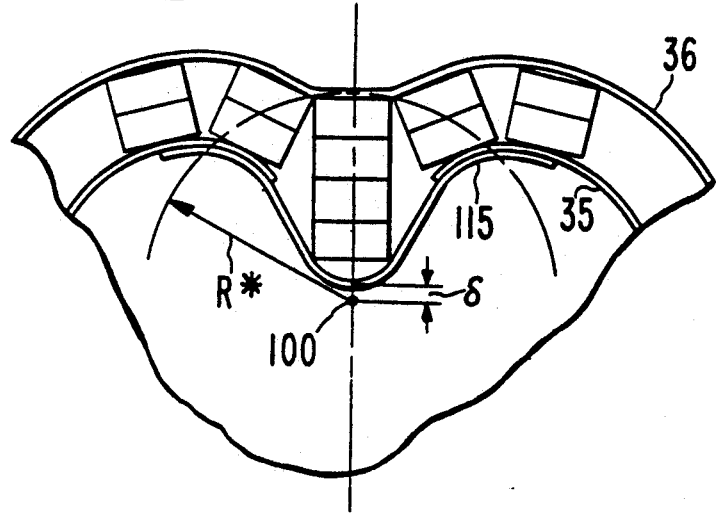
FIG. 12 shows an embodiment of the invention similar to FIG. 11A and having a position adjustable pole piece.

FIG. 12 shows another embodiment of the invention where the distance between the pole pieces is non-constant in region II. The magnet array is similar to the embodiment shown in FIG. 11A. Inner pole piece 115 for region II is a flexible pole piece having an adjustable intersection with the polar axis on either side of the center of rotation 100. The adjustment is made by means of the sliding engagement of pole piece 115 with pole piece 35.

In general, uniform erosion (E(R)=K, independent of R) will be obtained upon rotation of the path of erosion through an angle of $2\pi$ about the center of the target if $$\overline{B}_{=}^{2\pi}(R) = \frac{1}{2\pi} \int_0^{2\pi} B_{=}(R, \theta) d\theta \qquad \text{(D-11)}$$

is constant independent of R.

Therefore, $\overline{B}_x^{2\pi}$ is directly proportional to K. However, $$\frac{1}{2\pi} \int_0^{2\pi} B_{=}(R, \theta) d\theta = \frac{1}{2\pi} \left[ \sum_{i=1}^{N} \int_{\theta_{i-1}}^{\theta_i} B_{=}(R, \theta) d\theta \right], \qquad \text{(D-12)}$$

since $B_x(R,\theta)$ is zero except on the arc segments from $P(R,\theta_{i-1})$ to $P(R,\theta_i)$ in the path of erosion. Now $$\frac{1}{2\pi} \left[ \sum_{i=1}^{N} \int_{\theta_{i-1}}^{\theta_i} B_{=}(R, \theta) d\theta \right] = \qquad \text{(D-13)}$$

-continued $$\frac{1}{2\pi}\left[\frac{\sum_{i=1}^{N}\int_{\theta_{i-1}}^{\theta_i} B_=(R,\theta)d\theta}{\Sigma a_i}\right][\Sigma a_i] \quad$$

where $a_i = \theta_i - \theta_{i-1}$.

But, $\sum_{i=1}^{N} a_i = \frac{\Sigma L(\text{Arc}(R))}{R}$  (D-14)

Therefore, $$\overline{B}_=^{2\pi}(R) = \frac{1}{2\pi}[M(R)] \cdot \left[\frac{\Sigma L(\text{Arc}(R))}{R}\right] aK \quad \text{(D-15)}$$

In the general case, for all embodiments, $$\overline{B}_=^{2\pi}(R) = \frac{1}{2\pi}[M(R)] \cdot \left[\frac{\Sigma L(\text{Arc}(R))}{R}\right] = CE(R) \quad \text{(D-16)}$$

where C is constant.

Therefore, average magnetic strength $\overline{M}(R)$ varies inversely with the $$\frac{\Sigma L(\text{Arc}(R))}{R}$$

for uniform erosion.

The erosion E(R) will be an increasing function if $\overline{B}_x^{2N} = \overline{B}_x^{2\pi}$ is an increasing function, on an interval of R. The erosion E(R) will be a decreasing function if $\overline{B}_x^{2\pi}$ is a decreasing function on an interval of R. For example, uniform erosion can be achieved across a disk shaped region, centered at the center of rotation and having an outer radius of R', when $\overline{B}_x^{2\pi}$ is constant on the interval $\theta \leq R \leq R'$. The erosion can be made to increase uniformly on the interval $R' < R \leq R''$ by uniformly increasing $\overline{B}_x^{2\pi}$ on the interval $R' < R \leq R''$.

The path width of the stationary erosion may vary along the path, and the value of $\Sigma\text{Arc}(R)/R$ may therefore vary with R. However, if $\overline{M}(R)$ varies as the inverse of $\Sigma\text{Arc}(R)/R$, uniform erosion will result upon rotation of the path of erosion about the center of the magnetron target.

In the non-uniform case, given a preselected erosion profile E(R), we construct a magnet array which produces the preselected erosion profile upon rotation by selecting magnet strengths and a stationary erosion profile so that equation (D-16) is satisfied.

Figure 13:
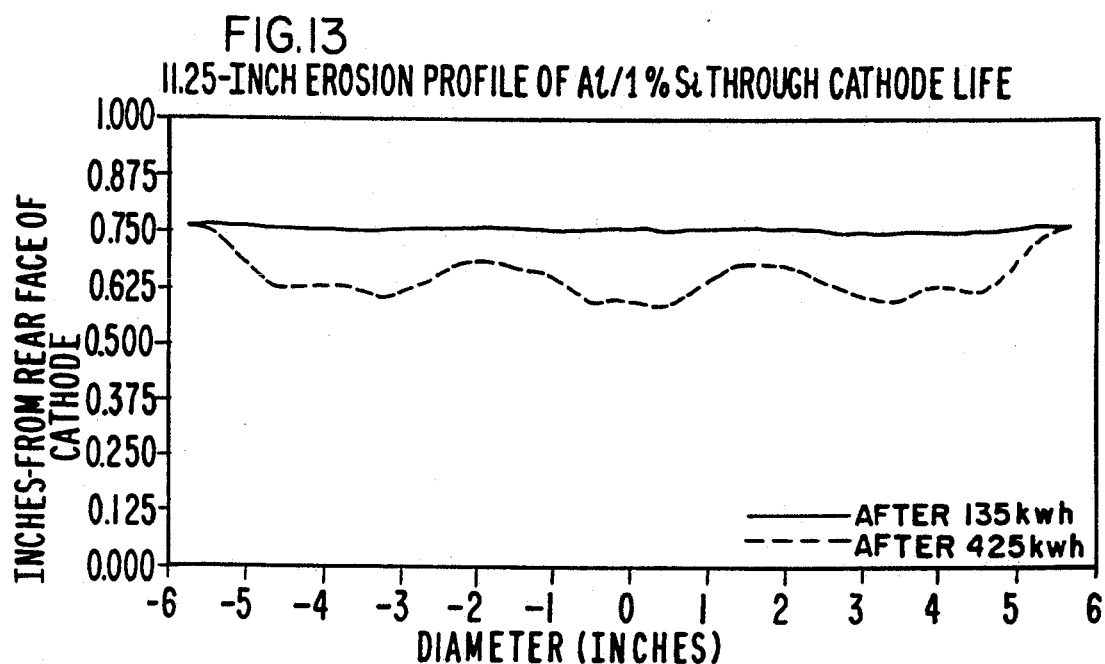
FIG. 13 shows the graph of the erosion uniformity produced by the embodiment shown in FIG. 7C when the structure is rotated about axis 100.

FIG. 13 shows the graph of the erosion uniformity produced by the embodiment shown in FIG. 7C when the structure is rotated about axis 100. After approximately 135 kilowatt hours of operation, the erosion across the center 10 inches of the target is essentially uniform (±1.3%). After 425 kilowatt hours of operation, the erosion has decreased in the region near±2 inches and has increased somewhat at the center, but the uniformity of erosion is still±8.7% of the average erosion. The two curves shown in FIG. 13 were generated while keeping the magnet assembly a fixed distance from the backside of the target so that the distance to the surface of the target was changing as the target eroded. If the assembly is operated a the same fixed distance to the back of the target, the erosion becomes more non-uniform as the depth of the erosion progresses and in particular becomes deeper at the center of the target. Nevertheless, the uniformity over these lifetimes is sufficient to coat on the order of thousands of wafers uniformly as may be seen in Table 2. Table 2 is a compilation of the film properties for aluminum films deposited with the embodiments shown in FIGS. 1 and 7C.

TABLE 2

| | | |
|---|---|---|
| Kilowatt hours: | 135 kwh | 425 kwh |
| # of 1 μm deps; | 911 | 2870 |
| Run Number: | A6111889-06 | A6121289-08 |
| Conditions: | | |
| Source/Substrate: | 5.4 cm | same |
| Deposition time: | 60 sec | same |
| Power: | 8.1 kw | 8.03 kw |
| | (522V, 15.6A, 34.5Ω) | (467V, 17.2A, 27.2Ω) |
| Heater set-point: | 300° C. | same |
| Argon pressure: | 2.5 mTorr | same |
| Results: | | |
| Deposition rate: | 9111 Å/min | 9076 Å/min |
| | 18.75 Å/kw-sec | 18.84 Å/kw-sec |
| Deposition rate variation over cathode life: | | ±.56% |
| Al/1% Si uniformity: Max-Min/2 × ave. (Alpha-Step) | ±2.5% | ±4.8% |
| Surface resistivity: | 31.78 mΩ/sq. | 32.42 mΩ/sq. |
| Std Dev (1 sigma): | 1.182% | 1.881% |
| Resistivity: | 2.90 μΩcm | 2.94 μΩcm |
| Uniformity of Resistivity: Max-Min/2 × mean | ±3.3% | ±3.7% |
| Reflectivity: (440 nm) | 68.2% | 77.4% |
| Max. grain size: | 7.7 μm | 12.8 μm |

The uniformity may be continued for longer operation by adjusting the distance between the top surface of the target and the magnet array so that this distance is kept approximately constant as erosion proceeds.

Figure 14:
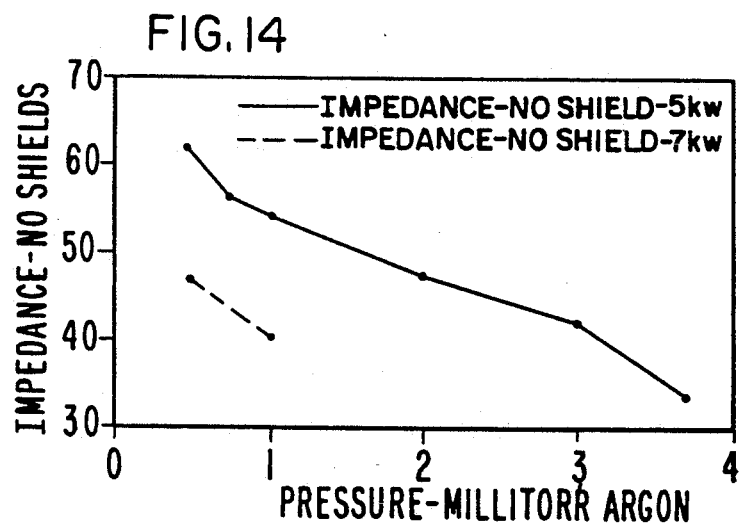
FIG. 14 shows the graph of the electrical impedance versus pressure in millitorr for the embodiment of FIG. 7A.

FIG. 14 shows a graph of the electrical impedance versus pressure in millitorr of the argon supplied to sputter chamber 18 (see FIG. 1) for the embodiment shown in FIG. 7A. Note that the impedance of the discharge is low for both 7 kilowatts and 5 kilowatts across the entire range of pressures shown. This is characteristic of a very efficient magnetron discharge. In particular, a magnetron discharge is maintained at partial pressures substantially less than 1 millitorr. Thus, the design of the invention with an average magnetic strength having a low value near the center of rotation relative to the value remote from the center, does not reduce the effectiveness of the magnetron discharge.

Figure 15:
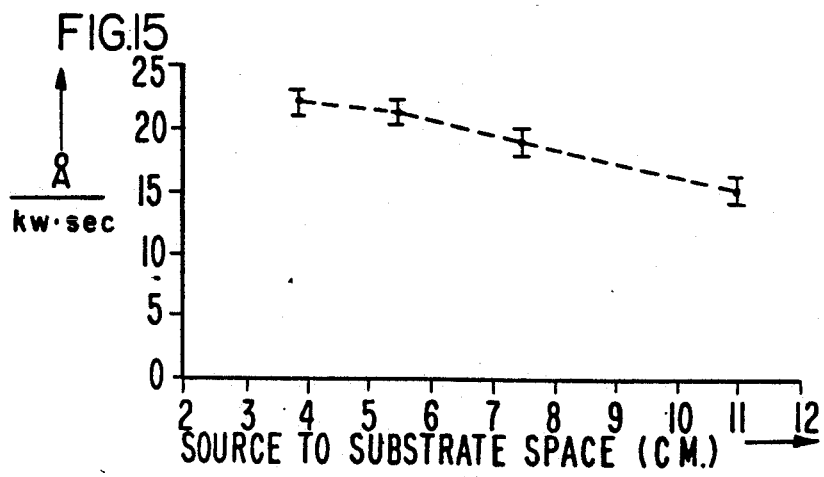
FIG. 15 shows a graph of collection efficiency as a function of distance.

FIG. 15 shows a graph of a collection efficiency as a function of the distance between the substrate being coated and the sputter surface of the target. Collection efficiency is measured in units of Angstroms of film thickness deposited per kilowatt second. We see from Table 2 that excellent film thickness uniformity, exceptional collection efficiency and high quality aluminum film properties result from operation of the embodiment in FIGS. 1 and 7 at a pressure of 2.5 millitorr and at a source of substrate distance of 5.4 cm, 18% of the diameter of the target.

Figure 16:
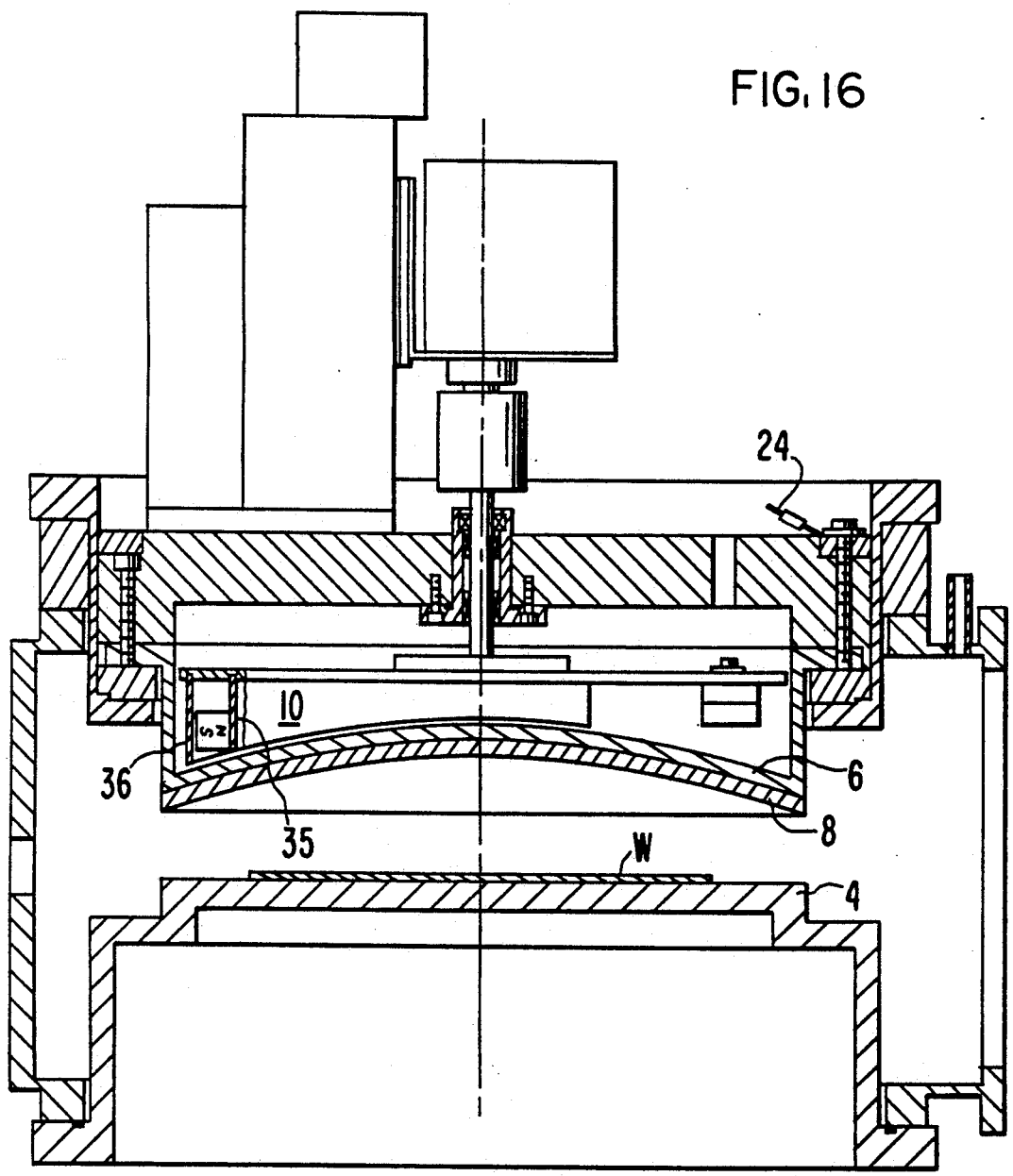
FIG. 16 shows an embodiment of the invention having a concave cathode.

FIG. 16 shows an alternate embodiment of the invention which is the same as the embodiment shown in FIG. 1 except that (1) target backing plate 6 and target 8 are both concavely curved as viewed from substrate support table 4, (2) magnet array housing 10 is curved to match the curvature of backing 6, and (3) the pole pieces for the magnet array extend from the backing plate of the magnet array so that the ends of the pole pieces proximate curved housing 10 are conformal with curved housing 10 (see FIG. 16). Each individual magnet in the array is then positioned adjacent the conformal end of the inner pole piece.

Curved target 8 and the uniform erosion thereof caused by the rotating operation of magnet array 12 serves to focus the sputtered vapor onto the surface of the substrate to be coated which tends to improve film collection efficiency. The curved target improves film thickness uniformity by increasing the arrival rate of sputtered vapor at the outer periphery of the substrate. The curvature of the dished cathode serves to prevent strain deformation due to the combined effect of vacuum and water pressure. Such deformation causes target debonding and leakage and shortens the target life. The pole pieces have different lengths in order to conform the ends of the pole pieces conformally with target 8. Such modification of the pole pieces has little effect on the magnetic flux tubes.

Figure 17:
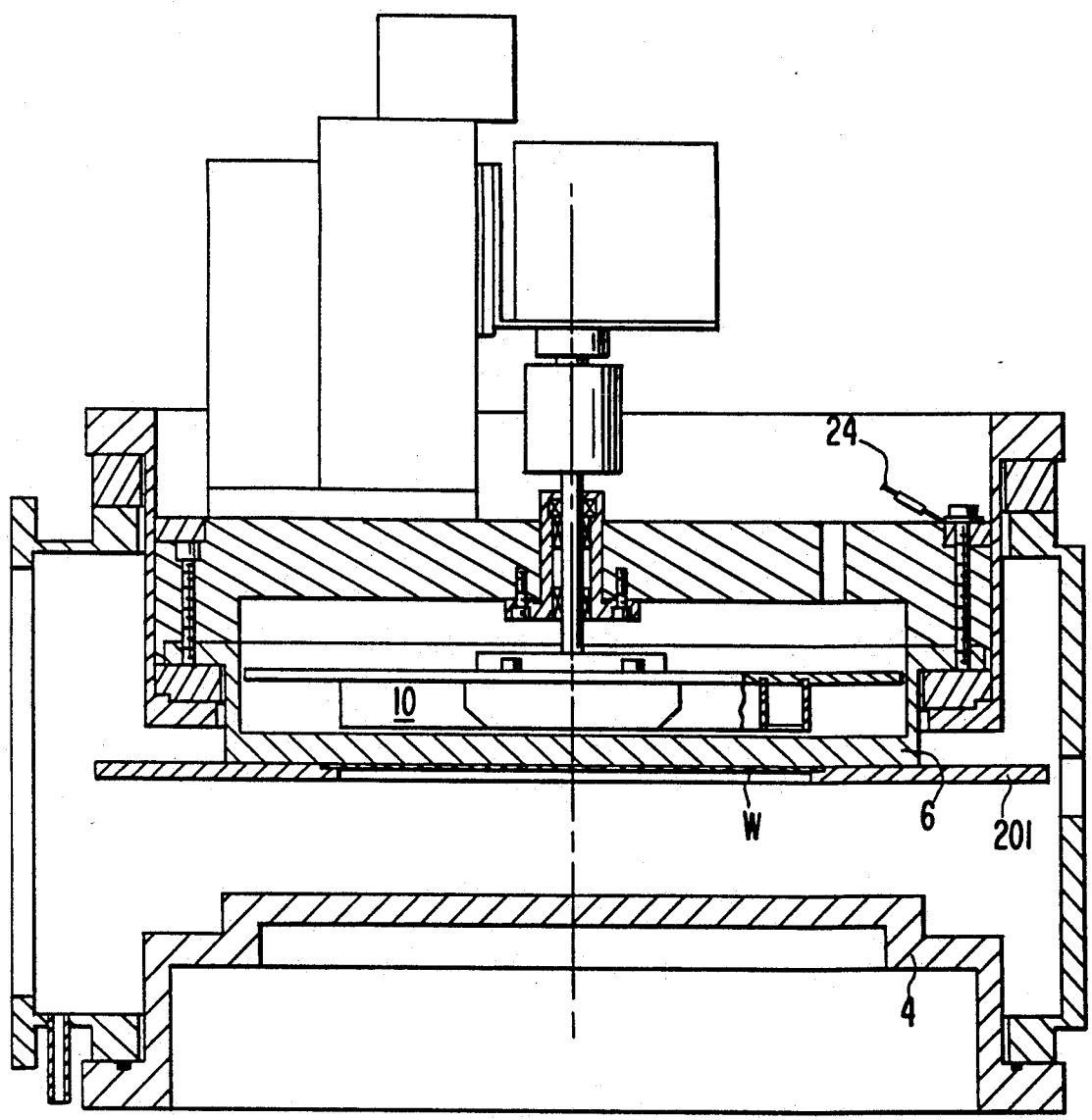
FIG. 17 shows an embodiment of the invention suitable for operation as an etch apparatus.

FIG. 17 shows an embodiment of the invention suitable for operation as an etch apparatus. Etch apparatus 200 shown in FIG. 17 is the same as the sputter apparatus of FIG. 1 except that target 8 (FIG. 1) is removed and substrate W is clamped against cathode 6 by circumferential wafer clamping means 201. In this configuration, for insulating substrates such as a silicon wafer, an alternating voltage source is connected to electrical connection 24 and housing portion 4 serves as an anode. In this embodiment uniform magnetron erosion of the target wafer or substrate is obtained.

Figure 18:
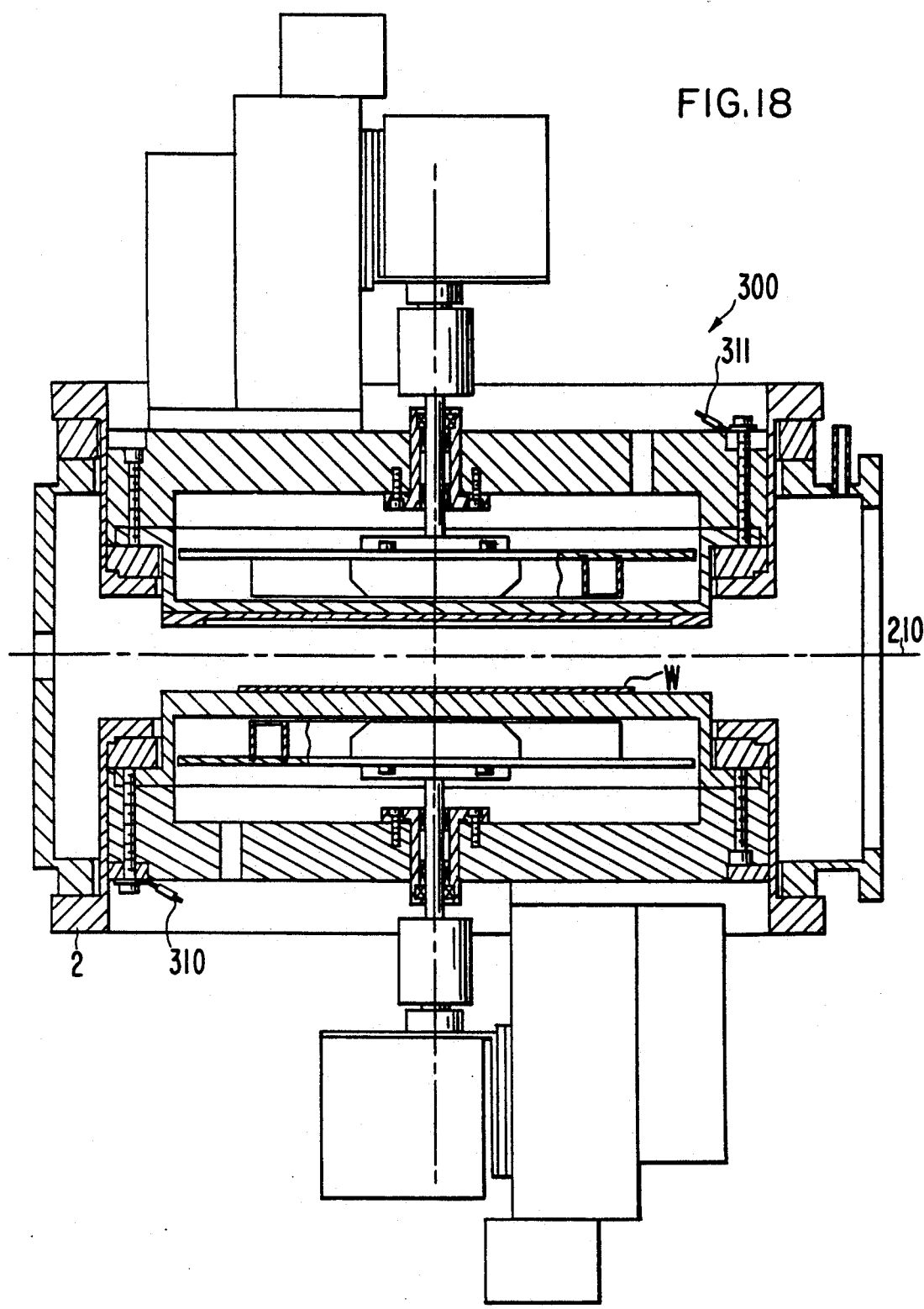
FIG. 18 shows an embodiment of the invention for simultaneously sputtering and etching a substrate.

FIG. 18 shows another embodiment of the invention suitable for sputter or etch or simultaneously sputtering and etching substrate W. The portion of sputter etch apparatus 300 above line 210 is the same as the corresponding portion of the sputter apparatus shown in FIG. 1. The portion of sputter etch apparatus 300 below line 210 is the same as the corresponding portion of FIG. 17. In this case, electrical connection 310 is connected to either an alternating voltage source or a negative DC voltage source and electrical connection 311 is similarly connected to either a negative DC voltage source or an alternating AC voltage source. In this embodiment, housing 2 is grounded and acts as the anode. Opposed cathodes 8 and 4 are parallel and in operation sputtering occurs from target 8 and from the surface of substrate W on cathode 4. Thus, the surface of substrate W is simultaneously sputter coated by atoms dislodged from the surface of sputter target 8 by the operation of the upper magnetron and sputter etched by the atoms dislodged from the surface of substrate W by the operation of the lower magnetron.

Figure 19A:
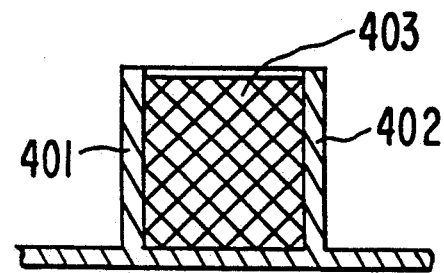
FIGS. 19A,B,C show an alternate embodiment for magnet array 12 in FIG. 1.
Figure 19B:
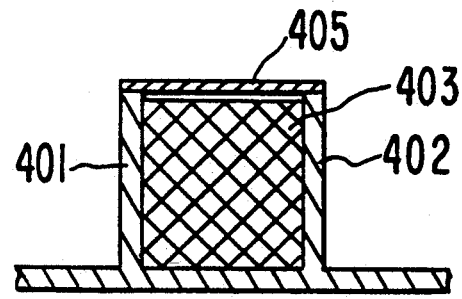
Figure 19C:
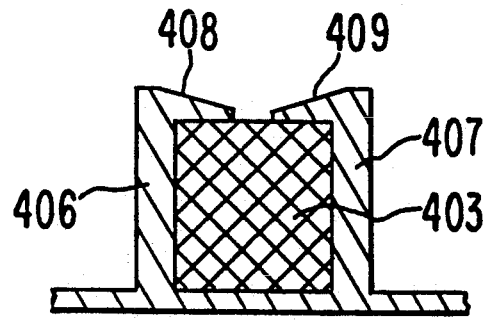

FIGS. 19A, B and C show an alternate embodiment for a magnet 12 shown in FIG. 1. FIG. 19A shows a cross-section of an electromagnet which may be used in connection with the present invention. Pole pieces 401 and 402 in FIG. 19A have the same shape as pole pieces 35 and 36 in FIG. 2A. Coil 403 replaces the permanent magnets shown in FIG. 2A. The strength of the magnet can be adjusted by thin magnetic shunt 405 between pole pieces. By the use of such shunts, the average value of $B_x$ at the surface of the target may be controlled in selected regions of the erosion path. FIG. 19C shows an alternate embodiment of the pole pieces. Pole piece 406 and pole piece 407 have shaped ends 408 and 409 which may serve both as a partial shunt to decrease the strength of the magnet in a specified amount in a specified region and also to shape the magnetic flux lines to tailor the width of the erosion region on the surface of the target.

The above embodiments of the invention are intended to be exemplary and not limiting.

We claim:

1. A magnetron apparatus comprising:
a vacuum chamber;
a first magnetron structure including an anode;
a cathode having a front surface in said vacuum chamber and a back surface;
closed loop magnetic means positioned behind said back surface for generating a magnetic field defining a closed loop magnetic tunnel on said front surface of said cathode in a region adjacent to said closed loop magnetic means;
means for rotating said magnetic means about an axis normal to and passing through said front surface, and
wherein said closed loop magnetic means comprises first and second portions, all points on said first portion being located a distance greater than or equal to a predetermined distance from said axis, and all points on said second portion being located a distance less than said predetermined distance from said axis, wherein said first portion of the magnetic means produces a substantially constant magnetic field strength along the adjacent region of said magnetic tunnel and wherein said second portion of the magnetic means produces a magnetic field of less intensity along the adjacent region of said magnetic tunnel.

2. A magnetron apparatus as in claim 1 wherein said front surface is flat so that rotation of said magnetic means sweeps out a circular erosion region on said front surface.

3. A magnetron apparatus as in claim 2 wherein said magnetic means is configured so that there are numbers $R_1$ and $R_2$ greater than zero such that the product of the average magnetic strength $\overline{M}(R)$ of said field at radius R and $\Sigma L(Arc(R))/R$ varies as the erosion profile $E(R)$ with R for $R_1 \leq R \leq R_2$.

4. A magnetron apparatus as in claim 1 wherein said magnetic means comprises a first closed loop pole piece and a second closed loop pole piece, said first pole piece having opposite magnetic polarity from said second pole piece, said axis of rotation passing between said first pole piece and said second pole piece.

5. A magnetron apparatus as in claim 1 wherein said magnetic means comprises pole pieces and said axis passes through one of said pole piece.

6. A magnetron apparatus as in claim 1 wherein said closed loop magnetic means has a v-shaped configuration in a neighborhood of said axis of rotation.

7. A magnetron apparatus as in claim 1 wherein said magnetic means includes an adjustable pole piece near said axis.

8. A magnetron apparatus as in claim 1 further including means for controlling the distance between said magnetic means and said front surface.

9. A magnetron apparatus as in claim 1 wherein said front surface is dish-shaped.

10. A magnetron apparatus as in claim 9 wherein a portion of said magnetic means comprises a pole piece configured conformally with a portion of said dish-shaped front surface.

11. A magnetron apparatus as in claim 1 wherein said front surface of said cathode is adapted to support a wafer so that said closed loop magnetic tunnel crosses the surface of said wafer for sputter etching said wafer.

12. A magnetron apparatus as in claim 1 further including a second magnetron structure disposed in opposition to said first magnetron structure.

13. A magnetron apparatus as in claim 1 wherein said magnetic means includes an array of magnetic elements, each positioned adjacent one another spaced evenly apart from said back surface and in substantial alignment with said closed loop magnetic tunnel.

14. A magnetron apparatus as in claim 13 wherein said means for rotating rotates said array about said axis.

15. A magnetron apparatus as in claim 1 wherein said magnetron apparatus comprises a sputter deposition apparatus.

16. A magnetron apparatus as in claim 1 wherein said magnetron apparatus comprises an etch apparatus.

17. A magnetron apparatus as in claim 1 wherein said second portion of said closed loop magnet means comprises two segments, said first segment producing a magnetic field of substantially uniform intensity along the adjacent region of said magnetic tunnel and said second segment producing a magnetic field of variable intensity along the adjacent region of said magnetic tunnel.

18. A magnetron apparatus comprising:
  a vacuum chamber;
  a magnetron structure including an anode;
  a cathode having a front surface in said vacuum chamber and a back surface;
  magnetic means positioned behind said back surface for generating a magnetic field defining arcuate magnetic field lines intersecting said front surface and enclosing a closed loop path adjacent to said front surface, said closed loop path defining a centerline whereat said magnetic field strength is greatest;
  means for rotating said magnetic means about an axis passing through and normal to said surface;
  said magnetic means comprising an array of individual magnets positioned between two continuous, generally parallel closed loop pole pieces defining a centerline therebetween, said centerline generally corresponding to said centerline of said magnetic field, wherein the strength and positioning of the magnets in said array is such that the magnetic field strength of said closed loop path is substantially a constant value at all locations on said magnetic field centerline greater than a predetermined distance from said axis and is less than said constant value at all locations less than said predetermined distance from said axis.

19. A magnetron apparatus as in claim 18 wherein said closed loop path comprises an erosion path.

20. A magnetron apparatus as in claim 18 further including means defining an electric field generally crossing said arcuate magnetic field lines.

21. A magnetron apparatus as in claim 20 wherein said magnetic field lines cooperate with said electric field to define only a single plasma ring.

22. A magnetron apparatus as in claim 18 wherein said magnetron apparatus comprises a sputter deposition apparatus.

23. A magnetron apparatus as in claim 18 wherein said magnetron apparatus comprises an etch apparatus.

24. A system for processing a wafer comprising:
  a vacuum chamber including an anode;
  a first magnetron apparatus within said vacuum chamber comprising:
    a first magnetron structure;
    a first cathode having a front surface in said vacuum chamber and a back surface;
    first closed loop magnetic means positioned behind said back surface of said first cathode for generating a magnetic field defining a closed loop magnetic field on said front surface of said first cathode in a region adjacent to said closed loop magnetic means; and
    means for rotating said first magnetic means about an axis which passes through and is normal to said first cathode front surface; and
  a second magnetron apparatus within said vacuum chamber comprising:
    a second magnetron structure;
    a second cathode having a front surface in said vacuum chamber and a back surface;
    second closed-loop magnetic means positioned behind said back surface of said second cathode for generating a magnetic field defining a closed loop magnetic field on said front surface of said second cathode in a region adjacent to said closed loop magnetic means; and
    means for rotating said second magnetic means about an axis which passes through and is normal to said second cathode front surface;
  wherein said first and second closed loop magnetic means each comprises first and second portions, all points on said first portion of each closed loop magnetic means being located a distance greater than or equal to a predetermined distance from the axis about which said magnetic means is rotated, and all points on said second portion of said closed loop magnetic means being located a distance less than said predetermined distance from the axis about which said magnetic means is rotated, wherein said first portion of each magnetic means produces a substantially constant magnetic field strength along the adjacent region of the adjacent cathode and wherein said second portion of the magnetic means produces a magnetic field of less intensity along the adjacent region of said cathode;
  wherein said first and second cathodes face each other, and wherein said first magnetron apparatus is primarily used for sputtering and said second magnetron apparatus is primarily used for etching.

25. A rotating magnet for use in a magnetron apparatus, comprising:
  first and second closed loop pole pieces defining a magnet centerline therebetween;
  an array of individual magnets positioned between said pole pieces; and
  means for rotating said magnet about an axis;
  wherein said closed loop comprises first and second regions, the first region being defined as the portion of the magnet along the points on the centerline greater than a predetermined distance from the axis of rotation, and the second region being defined as that portion of the magnet along the points on the centerline less than said predetermined distance from the axis of rotation, all of the magnets positioned in said first region being substantially equal in strength and substantially evenly spaced apart so as to produce a magnetic field which has a substantially constant intensity adjacent to said magnet centerline, and wherein at least some of the magnets positioned in said second region have a substantially lower strength than the magnets of said first region, such that the magnetic field intensity adjacent to the magnet centerline in said second region is substantially less than in said first region.

26. The magnet of claim 25 wherein the magnetic field intensity in a portion of said second region is constant.

27. The magnet of claim 25 wherein the magnetic field intensity in a portion of said second region varies as a function of the distance from the axis of rotation.

28. The magnet of claim 25 wherein said pole pieces are substantially evenly spaced apart in said first region.

* * * * *

UNITED STATES PATENT AND TRADEMARK OFFICE
CERTIFICATE OF CORRECTION

PATENT NO : 5,252,194
DATED : October 12, 1993
INVENTOR(S) : Demaray et al

It is certified that error appears in the above-identified patent and that said Letters Patent are hereby corrected as shown below:

Column 1, line 6, after "abandoned" insert -- , which is a continuation-in-part of S. N. 355,713 filed on May 22, 1989, now U. S. Pat. No. 4,995,958, for "Sputtering Apparatus With A Rotating Magnet Array Having a Geometry for Specified Target Erosion Profile" and commonly assigned with the present invention --

Signed and Sealed this

Fifteenth Day of May, 2001

*Attest:*

NICHOLAS P. GODICI

*Attesting Officer*     *Acting Director of the United States Patent and Trademark Office*